US012153236B2

United States Patent
Kuwayama et al.

(10) Patent No.: US 12,153,236 B2
(45) Date of Patent: Nov. 26, 2024

(54) POLARIZING ELEMENT, CIRCULARLY POLARIZING PLATE, AND IMAGE DISPLAY DEVICE

(71) Applicant: FUJIFILM Corporation, Tokyo (JP)

(72) Inventors: Yasukazu Kuwayama, Kanagawa (JP); Fumitake Mitobe, Kanagawa (JP); Yuzo Fujiki, Kanagawa (JP); Jun Takeda, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 17/697,558

(22) Filed: Mar. 17, 2022

(65) Prior Publication Data

US 2022/0206202 A1    Jun. 30, 2022

Related U.S. Application Data

(63) Continuation of application No. 16/587,717, filed on Sep. 30, 2019, now Pat. No. 11,415,733, which is a continuation of application No. PCT/JP2018/014815, filed on Apr. 6, 2018.

(30) Foreign Application Priority Data

Apr. 7, 2017    (JP) ................................. 2017-077162
Jun. 16, 2017    (JP) ................................. 2017-119097

(51) Int. Cl.
*G02B 5/30*    (2006.01)
*C09K 19/56*    (2006.01)
*G02F 1/1335*    (2006.01)
*G09F 13/00*    (2006.01)
*H10K 50/86*    (2023.01)

(52) U.S. Cl.
CPC ............ *G02B 5/3016* (2013.01); *C09K 19/56* (2013.01); *G02F 1/133528* (2013.01); *G09F 13/005* (2013.01); *C09K 2323/03* (2020.08); *C09K 2323/031* (2020.08); *G02F 1/133541* (2021.01); *H10K 50/865* (2023.02)

(58) Field of Classification Search
None
See application file for complete search history.

(56) References Cited

U.S. PATENT DOCUMENTS

| | | | | |
|---|---|---|---|---|
| 2006/0177607 A1* | 8/2006 | Ohmori | ................. | G02B 5/3083 428/1.31 |
| 2008/0273153 A1 | 11/2008 | Takeda et al. | | |
| 2012/0038858 A1 | 2/2012 | Ichihashi et al. | | |
| 2013/0070899 A1* | 3/2013 | Morishima | ............. | C09B 56/02 378/71 |
| 2014/0293197 A1* | 10/2014 | Shin | ......................... | G02B 1/14 359/489.07 |
| 2016/0131809 A1* | 5/2016 | Takeda | ................ | G02F 1/13363 349/194 |
| 2016/0216424 A1* | 7/2016 | Seo | ......................... | G02B 1/14 |

FOREIGN PATENT DOCUMENTS

| | | | | |
|---|---|---|---|---|
| CN | 101107559 A | 1/2008 | | |
| JP | 2010-175931 A | 8/2010 | | |
| JP | 2011-048309 A | 3/2011 | | |
| JP | 2011-215336 A | 10/2011 | | |
| JP | 5308901 B2 | 10/2013 | | |
| JP | 2013210624 A * | 10/2013 | ............ | C09B 43/30 |
| JP | 5437744 B2 | 3/2014 | | |
| JP | 5566178 B2 | 8/2014 | | |
| JP | 2016-004055 A | 1/2016 | | |
| KR | 10-2006-0004655 A | 1/2006 | | |

OTHER PUBLICATIONS

Notice of Reasons for Revocation issued by the Japanese Patent Office on Apr. 7, 2022, in connection with Japanese Patent Application No. 2019-511327.
International Search Report issued in PCT/JP2018/014815 on Jul. 10, 2018.
Written Opinion issued in PCT/JP2018/014815 on Jul. 10, 2018.
International Preliminary Report on Patentability completed by WIPO on Oct. 8, 2019 in connection with International Patent Application No. PCT/JP2018/014815.
Office Action, issued by the Japanese Patent Office on Sep. 15, 2020, in connection with Japanese Patent Application No. 2019-511327.
Non-Final Office Action issued in U.S. Appl. No. 16/587,717 on Jul. 6, 2021.
Final Office Action issued in U.S. Appl. No. 16/587,717 on Dec. 17, 2021.
Office Action, issued by the Korean Intellectual Property Office on Sep. 21, 2020, in connection with Korean Patent Application No. 10-2019-7029019.
Office Action, issued by the State Intellectual Property Office on Feb. 3, 2021, in connection with Chinese Patent Application No. 201880023180.1.
Office Action, issued by the Japanese Patent Office on Nov. 9, 2021, in connection with Japanese Patent Application No. 2019-511327.

* cited by examiner

*Primary Examiner* — Anthony J Frost
(74) *Attorney, Agent, or Firm* — Edwards Neils LLC; Jean C. Edwards, Esq.

(57) ABSTRACT

Provided is a polarizing element which has an excellent antireflection function as being applied to an image display device; and a circularly polarizing plate and an image display device, each of which has the polarizing element. The polarizing element has an alignment film and an anisotropic light-absorbing film formed using a dichroic substance, in which a degree S of alignment of the anisotropic light-absorbing film is 0.92 or more, and an average refractive index $n_{ave}$ at a wavelength of 400 to 700 nm of the alignment film is 1.55 to 2.0.

19 Claims, No Drawings

POLARIZING ELEMENT, CIRCULARLY POLARIZING PLATE, AND IMAGE DISPLAY DEVICE

CROSS-REFERENCE TO RELATED APPLICATIONS

The present application is a Continuation of U.S. application Ser. No. 16/587,717, filed Sep. 30, 2019, which is a Continuation of PCT International Application No. PCT/JP2018/014815 filed on Apr. 6, 2018, which was published under PCT Article 21(2) in Japanese, and which claims priority under 35 U.S.C. § 119(a) to Japanese Patent Application No. 2017-077162 filed on Apr. 7, 2017 and Japanese Patent Application No. 2017-119097 filed on Jun. 16, 2017. The above applications are hereby expressly incorporated by reference, in their entirety, into the present application.

BACKGROUND OF THE INVENTION

1. Field of the Invention

The present invention relates to a polarizing element, a circularly polarizing plate, and an image display device.

2. Description of the Related Art

In recent years, development of a flexible organic light emitting diode (OLED) has been in process and enhancement flexibility for each member used has been in progress. Above all, a circularly polarizing plate used for preventing the reflection of external light is required to have a high degree of polarization and flexibility. In the related art, an iodine polarizer has been used in the circularly polarizing plate. Since the iodine polarizer is created by dissolving or adsorbing iodine in or onto a high-molecular material such as polyvinyl alcohol to stretch the film at a high ratio in one direction into a shape of a film, sufficient flexibility was not attained.

In this regard, use of a polarizing element in which a dichroic substance is applied onto a substrate such as glass and a transparent film and aligned using an intermolecular action or the like has been studied. For example, in JP5437744B, a polarizing element which has a high concentration of a dichroic substance, is a thin film, and has a high degree of polarization has been proposed.

SUMMARY OF THE INVENTION

However, the present inventors have conducted studies, and as a result, they have found that in a case where the concentration of a dichroic substance is increased, the degree of alignment of the anisotropic light-absorbing film can be increased, and therefore, although a polarizing element having a high degree of polarization is obtained, the antireflection function is lowered.

Therefore, an object of the present invention is to provide a polarizing element which has an excellent antireflection function as being applied to an image display device; and a circularly polarizing plate and an image display device, each of which has the polarizing element.

The present inventors have conducted extensive studies, and as a result, they have found that a polarizing element having an anisotropic light-absorbing film having an alignment film and a dichroic substance, which has an excellent antireflection function in a case where a degree S of alignment of the anisotropic light-absorbing film is 0.92 or more and an average refractive index $n_{ave}$ at a wavelength of 400 to 700 nm of the alignment film is 1.55 to 2.0, is obtained.

That is, the object can be accomplished by the following configuration.

[1] A polarizing element comprising:
an alignment film; and
an anisotropic light-absorbing film formed using a dichroic substance,
in which a degree S of alignment of the anisotropic light-absorbing film is 0.92 or more, and
an average refractive index $n_{ave}$ at a wavelength of 400 to 700 nm of the alignment film is 1.55 to 2.0.

[2] The polarizing element as described in [1],
in which an in-plane refractive index anisotropy Δn at a wavelength of 550 nm of the alignment film is 0.10 or more.

[3] The polarizing element as described in [2],
in which the refractive index anisotropy Δn is 0.20 or more.

[4] The polarizing element as described in any one of [1] to [3],
in which the average refractive index $n_{ave}$ is 1.55 to 1.80.

[5] The polarizing element as described in any one of [1] to [4],
in which an average refractive index $n_{550}$ at a wavelength of 550 nm of the alignment film is 1.55 to 1.75.

[6] The polarizing element as described in any one of [1] to [5],
in which a ratio of an average refractive index $n_{450}$ at a wavelength of 450 nm of the alignment film to the average refractive index $n_{550}$ at a wavelength of 550 nm of the alignment film is 1.0 or more.

[7] The polarizing element as described in any one of [1] to [6],
in which in a case where a refractive index of the anisotropic light-absorbing film is defined as $Nx_{550}$ and a refractive index of the alignment film is defined as $nx_{550}$ in a direction in which an in-plane refractive index of the anisotropic light-absorbing film at a wavelength of 550 nm is maximized, and
a refractive index of the anisotropic light-absorbing film is defined as $Ny_{550}$ and a refractive index of the alignment film is defined as $ny_{550}$ in a direction in-plane perpendicular to the direction in which the in-plane refractive index of the anisotropic light-absorbing film is maximized,
Formula (1) is satisfied, $$|Nx_{550}-nx_{550}|+|Ny_{550}-ny_{550}|<0.3 \qquad \text{Formula (1)}.$$

[8] The polarizing element as described in any one of [1] to [7],
in which a content of the dichroic substance is 8% to 22% by mass with respect to a total solid content mass of the anisotropic light-absorbing film.

[9] The polarizing element as described in any one of [1] to [8],
in which a thickness of the alignment film is 10 nm to 100 nm.

[10] The polarizing element as described in any one of [1] to [9],
in which the alignment film is a photo-alignment film formed using a photoactive compound having a photoreactive group having an azo group.

[11] The polarizing element as described in [10],
in which the photoactive compound is a compound represented by Formula (I) which will be described later,
in Formula (I) which will be described later, $R^{21}$, $R^{22}$, $R^{23}$, and $R^{24}$ each independently represent a hydrogen atom or a substituent, provided that at least one of $R^{21}$, $R^{22}$, $R^{23}$, or $R^{24}$ represents a carboxy group, a sulfo group, or a salt thereof, and in Formula (I) which will be described later, m represents an integer of 1 to 4, n represents an integer of 1 to 4, o represents an integer of 1 to 5, p represents an integer of 1 to 5, and in a case where m, n, o, and p are each an integer of 2 or more, a plurality of $R^{21}$'s, $R^{22}$'s, $R^{23}$'s, and $R^{24}$'s may be the same as or different from each other, respectively.

[12] The polarizing element as described in [10] or [11],
in which the photo-alignment film includes a binder component having a refractive index of 1.50 to 1.60, and
a content of the binder component is 10% by mass or more with respect to a total solid content mass of the photo-alignment film.

[13] The polarizing element as described in any one of [1] to [9],
in which the alignment film is a film formed using either or both of polyamic acid and polyimide compounds.

[14] The polarizing element as described in any one of [1] to [13],
in which the dichroic substance includes a compound represented by Formula (II) which will be described later,
in Formula (II) which will be described later, $R^{31}$, $R^{32}$, $R^{33}$, $R^{34}$, and $R^{35}$ each independently represent a hydrogen atom or a substituent, $R^{36}$ and $R^{37}$ each independently represent a hydrogen atom or an alkyl group which may have a substituent, $Q^{31}$ represents an aromatic hydrocarbon group, an aromatic heterocyclic group, or a cyclohexane ring group, which may have a substituent, $L^{31}$ represents a divalent linking group, $A^{31}$ represents an oxygen atom or a sulfur atom, and $R^{36}$, $R^{37}$, and $Q^{31}$ may have a radically polymerizable group as a substituent.

[15] The polarizing element as described in any one of [1] to [14],
in which the anisotropic light-absorbing film exhibits reverse wavelength dispersibility.

[16] The polarizing element as described in any one of [1] to [15], further comprising a substrate,
in which the polarizing element has the substrate, the alignment film, and the anisotropic light-absorbing film in this order.

[17] A circularly polarizing plate comprising:
the polarizing element as described in any one of [1] to [16]; and
a ¼ wavelength plate.

[18] An image display device comprising:
the polarizing element as described in any one of [1] to [16] or the circularly polarizing plate as described in [17]; and
an image display element.

According to the present invention, it is possible to provide a polarizing element which has an excellent antireflection function as being applied to an image display device; and a circularly polarizing plate and an image display device, each of which has the polarizing element.

DESCRIPTION OF THE PREFERRED EMBODIMENTS

Hereinafter, the present invention will be described in detail.
Description of configuration requirements described below may be made on the basis of representative embodiments of the present invention in some cases, but the present invention is not limited to such embodiments.

Furthermore, in the present specification, a numerical range expressed using "to" is used in a meaning of a range that includes the preceding and succeeding numerical values of "to" as the lower limit value and the upper limit value, respectively.

In addition, in the present specification, being parallel and being perpendicular do not mean parallel and perpendicular in strict meanings, respectively, but mean ranges within ±5° from being parallel or perpendicular.

Moreover, in the present specification, (meth)acrylic acid is a generic term indicating both of "acrylic acid" and "methacrylic acid", (meth)acryloyl is a generic term indicating both of "acryloyl" and "methacryloyl", (meth)acryloyloxy is a generic term indicating both of "acryloyloxy" and "methacryloyloxy", and (meth)acrylate is a generic term indicating both of "acrylate" and "methacrylate".

In addition, in the present specification, a liquid crystalline composition and a liquid crystalline compound also encompass those already not exhibiting liquid crystallinity by curing or the like in their concepts.

[Degree of Alignment of Anisotropic Light-Absorbing Film]

A degree S of alignment of the anisotropic light-absorbing film in the present invention is a value calculated according to the following formula by setting the anisotropic light-absorbing film on a sample table in a state where a linear polarizer is inserted into the side of a light source of an optical microscope (manufactured by Nikon Corporation, product name "ECLIPSE E600 POL"), and measuring an absorbance of the anisotropic light-absorbing film using a multi-channel spectrometer (manufactured by Ocean Optics Inc., product name "QE65000").

$$\text{Degree of alignment:} S=[(Az0/Ay0)-1]/[(Az0/Ay0)+2]$$

Az0: Absorbance with respect to polarized light in the direction of an absorption axis of the anisotropic light-absorbing film Ay0: Absorbance with respect to polarized light in the direction of a transmission axis of the anisotropic light-absorbing film

[Refractive Index]

A refractive index of each of the anisotropic light-absorbing film and the alignment film in the present invention is a value measured using a spectral ellipsometer M-2000U manufactured by J. A. Woollam Co.

Specifically, at a predetermined wavelength t [nm], a direction in which an in-plane refractive index of the anisotropic light-absorbing film is maximized is defined as an x-axis, a direction perpendicular thereto is defined as a y-axis, a direction normal to the in-plane is defined as a z-axis, a refractive index in the x-axis direction is defined as Nxt, a refractive index in the y direction is defined as Nyt, and a refractive index in the z direction is defined as Nzt. For example, in a case where the measurement wavelength is 550 nm, a refractive index in the x-axis direction is referred to as $Nx_{550}$, a refractive index in the y-axis direction is referred to as $Ny_{550}$, and a refractive index in the z-axis direction is referred to as $Nz_{550}$.

A refractive index of the alignment film in the embodiment of the present invention is also measured in the same manner as for the refractive index of the anisotropic light-absorbing film, and the refractive index in the x-axis direction (that is, a direction in which the in-plane refractive index of the anisotropic light-absorbing film is maximized) is defined as nxt, the refractive index in the y-axis direction is defined as nyt, and the refractive index in the z-axis direction is defined as nzt. For example, in a case where the measurement wavelength is 550 nm, the refractive index in the x-axis direction is defined as $nx_{550}$, and in a case where the refractive index in the y-axis direction is defined as $ny_{550}$, the refractive index in the z-axis direction is defined as $nz_{550}$.

The average refractive index $n_{ave}$ at a wavelength range of 400 to 700 nm of the alignment film in the embodiment of the present invention is calculated by Formula (R1) using an average value $nx_{ave}$ of the refractive index in the x-axis direction and an average value $ny_{ave}$ of the refractive index in the y-axis direction by measuring nxt and nyt at every nm in a wavelength range of 400 to 700 nm.

Average refractive index $n_{ave}=(nx_{ave}+ny_{ave})/2$ $nx_{ave}=(nx_{400}+nx_{401}+nx_{402}+\ldots+nx_{699}+nx_{700})/301$ $ny_{ave}=(ny_{400}+ny_{401}+ny_{402}+\ldots+ny_{699}+ny_{700})/301$ (R1)

The average refractive index $n_{550}$ at a wavelength of 550 nm of the alignment film in the embodiment of the present invention is calculated by Formula (R2).

Average refractive index $n_{550}=(nx_{550}+ny_{550})/2$ (R2)

The in-plane refractive index anisotropy Δn at a wavelength 550 nm of the alignment film in the embodiment of the present invention is calculated by Formula (R3).

Refractive Index Anisotropy $\Delta n=nx_{550}-ny_{550}$ (R3)

[Retardation]

In the present invention, Re(λ) and Rth(λ) represent an in-plane retardation and a thickness direction retardation at a wavelength of λ, respectively. Unless otherwise specified, the wavelength of λ is defined as 550 nm.

In the present invention, Re(λ) and Rth(λ) are values measured at a wavelength of λ in AxoScan OPMF-1 (manufactured by Opto Science, Inc.). By inputting the average refractive index ((Nx+Ny+Nz)/3) and the film thickness (d(μm)) to AxoScan, it is possible to calculate:

Slow axis direction)(°)

Re(λ)=R0(λ)

Rth(λ)=((Nx+Ny)/2−Nz)×d.

In addition, R0(λ) is expressed in a numerical value calculated with AxoScan OPMF-1, but means Re(λ).

The refractive indices Nx, Ny, and Nz used for the calculation of a retardation are measured using an Abbe refractometer (NAR-4T, manufactured by Atago Co., Ltd.) and a sodium lamp (λ=589 nm) as a light source. In addition, in a case where wavelength dependency is measured, the wavelength dependency can be measured with a multi-wavelength Abbe refractometer DR-M2 (manufactured by Atago Co., Ltd.) in combination with an interference filter.

In addition, the values mentioned in Polymer Handbook (JOHN WILEY & SONS, INC.) and the catalogues of various optical films can be used. The values of the average refractive indices of major optical films are exemplified below: cellulose acylate (1.48), cycloolefin polymer (1.52), polycarbonate (1.59), polymethyl methacrylate (1.49), and polystyrene (1.59).

[Polarizing Element]

The polarizing element of an embodiment of the present invention has an alignment film and an anisotropic light-absorbing film including a dichroic substance, in which a degree S of alignment of the anisotropic light-absorbing film is 0.92 or more and an average refractive index $n_{ave}$ at a wavelength of 400 to 700 nm of the alignment film is 1.55 to 2.0.

In a case where the polarizing element of the embodiment of the present invention is applied to an image display device, an excellent antireflection function can be exhibited. Details of reason thereof are not clear, but is usually presumed as follows.

Examples of a method for improving the flexibility of an anisotropic light-absorbing film including a dichroic substance include a method in which the thickness of an anisotropic light-absorbing film is decreased. In a case where such a thin film of the anisotropic light-absorbing film is used, a method in which an anisotropic light-absorbing film having a high degree of alignment, obtained by increasing the degree of alignment of a dichroic substance included in an anisotropic light-absorbing film while increasing the concentration of the dichroic substance is used can be mentioned as one of methods for obtaining a polarizing element having a high degree of polarization.

However, in a case where an anisotropic light-absorbing film having a high degree of alignment (that is, a dichroic substance having a high degree of alignment) is used, the refractive index anisotropy of the dichroic substance in the visible light region (at a wavelength of approximately 400 to 700 nm) is enhanced. As a result, it is thought that the internal reflection at an interface between the anisotropic light-absorbing film and an alignment film adjacent thereto is increased, and thus, the antireflection function of the polarizing element is lowered.

With regard to this problem, the present inventors have found that an excellent antireflection function can be exhibited upon application of an alignment film to an image display device in a case where a refractive index in the visible light region of the alignment film is set to be in a predetermined range. It is presumed that by setting the refractive index in the visible light region of the alignment film to be in a predetermined range as above, a refractive index in the visible light region of the anisotropic light-absorbing film and a refractive index in the visible light region of the alignment film are suitable, and the internal reflection at an interface between the anisotropic light-absorbing film and the alignment film can be suppressed.

[Alignment Film]

The alignment film in the embodiment of the present invention has an average refractive index $n_{ave}$ at a wavelength of 400 to 700 nm of 1.55 to 2.0. With this, even in a case where an anisotropic light-absorbing film having a high degree of alignment is used, a polarizing element having an excellent antireflection function is obtained.

The average refractive index $n_{ave}$ of the alignment film is preferably 1.55 to 1.80, and more preferably 1.60 to 1.80 from the viewpoint that the antireflection function of the polarizing element is more excellent.

The average refractive index $n_{550}$ at a wavelength of 550 nm of the alignment film is preferably 1.55 to 1.80, more preferably 1.55 to 1.75, and still more preferably 1.60 to 1.75. The light at a wavelength of 550 nm is a light at a wavelength such that the light is easily visibly recognized to the human eyes. In a case where the average refractive index $n_{550}$ of the alignment film is within the range, the reflected light is hardly visibly recognized, and therefore, the antireflection function of the polarizing element is more improved.

The in-plane refractive index anisotropy Δn at a wavelength of 550 nm of the alignment film is preferably 0.10 or more, and more preferably 0.20 or more from the viewpoint that the antireflection function of the polarizing element is further improved.

An upper limit value of the in-plane refractive index anisotropy Δn at a wavelength of 550 nm of the alignment film is preferably 0.45 or less, more preferably 0.40 or less, and still more preferably 0.30 or less since the antireflection function of the polarizing element is lowered.

A ratio ($n_{450}/n_{550}$) of the average refractive index $n_{450}$ at a wavelength of 450 nm of the alignment film to the average refractive index $n_{550}$ at a wavelength of 550 nm of the alignment film is preferably 1.0 or more, and more preferably 1.05 or more from the viewpoint that the antireflection function of the polarizing element is further improved.

An upper limit value of the ratio ($n_{450}/n_{550}$) is preferably 1.2 or less, and more preferably 1.1 or less from the viewpoint that the reflected light of the polarizing element is suppressed from being tinted.

The thickness of the alignment film is preferably 10 to 10,000 nm, more preferably 10 to 1000 nm, still more preferably 10 to 300 nm, and particularly preferably 10 to 100 nm. In particular, in a case where the thickness of the alignment film is in a range of 10 to 100 nm, it is possible to suppress the internal reflection by light on a short wavelength side among the visible lights, using an interference action, and therefore, it is possible to suppress the reflected light from being tinted. Thus, the antireflection function of the polarizing element is further improved.

In a case where an anisotropic light-absorbing film is coated and formed on an alignment film, it is preferable that the alignment film has solvent resistance to an extent that the alignment film is not dissolved by application of an anisotropic light-absorbing film composition. In addition, it is preferable that the alignment film has heat resistance in a heating treatment for removal of a solvent or for alignment of liquid crystals.

The alignment film may be, but not limited to, a film formed using an alignment polymer (for example, an alignment polymer composition including an alignment polymer and a solvent which will be described later).

Examples of the alignment polymer include polyamides, gelatins, polyimides, polyamic acid, polyvinyl alcohols, alkyl-modified polyvinyl alcohols, polyacrylamides, polyoxazoles, polyethylenimine, polystyrene, polyvinylpyrrolidone, polyacrylic acids, and polyacrylic acid esters. These alignment polymers may be used alone or in combination of two or more kinds thereof. Among these, either or both of the polyamic acid and the polyimide compounds are preferably used from the viewpoints that various refractive indices are easily set to be within the above-mentioned range, that the solvent resistance is excellent and that the heat resistance is excellent.

The alignment film may be a photo-alignment film from the viewpoints that various refractive indices are easily set to be within the above-mentioned range, that the solvent resistance is excellent, and that the heat resistance is excellent.

In the present invention, the photo-alignment film means a film formed using a photoactive compound. The photo-alignment film is formed by applying, for example, a composition (hereinafter also referred to as a "composition for forming a photo-alignment film") including a photoactive compound and a solvent onto, for example, a substrate which will be described later, and performing irradiation with polarized light (preferably polarized ultraviolet (UV)) to impart alignment regulating force.

The photoactive compound is a compound having a photoreactive group, and may be either a polymer or a monomer. The photoreactive group refers to a group generating a liquid crystal alignment ability by irradiation with light. Specifically, the photoreactive group causes alignment induction of molecules generated by irradiation with light, or photoreaction that is an origin of a liquid crystal alignment capability, such as an isomerization reaction, a dimerization reaction, a photocrosslinking reaction, or a photodegradation reaction.

The photoreactive group preferably has an unsaturated bond, more preferably has a double bond, and still more preferably has a group having at least one bond selected from the group consisting of a carbon-carbon double bond (C=C bond), a carbon-nitrogen double bond (C=N bond), a nitrogen-nitrogen double bond (N=N bond; also referred to as an "azo group"), and a carbon-oxygen double bond (C=O bond).

Examples of the photoreactive group having a C=C bond include a vinyl group, a polyene group, a stilbene group, a stilbazole group, a stilbazolim group, a chalcone group, and a cinnamoyl group.

Examples of the photoreactive group having a C=N bond include a group having a structure of an aromatic Schiff's base, an aromatic hydrazone, or the like.

Examples of the photoreactive group having an N=N bond (azo group) include an azobenzene group, an azonaphthalene group, an aromatic heterocyclic azo group, a bisazo group, a formazan group, and a group having azoxybenzene as a basic structure.

Examples of the photoreactive group having a C=O bond include a benzophenone group, a coumarine group, an anthraquinone group, and a maleimido group.

These photoreactive groups may have a substituent such as an alkyl group, an alkoxy group, an aryl group, an allyloxy group, a cyano group, an alkoxycarbonyl group, a hydroxy group, a sulfonic acid group, and a halogenated alkyl group.

Among these, the photoreactive group having an N=N bond (azo group) is preferable, and the azobenzene group is more preferable, from the viewpoints that a polarization irradiation amount required for photo-alignment is relatively small, that a photo-alignment film having excellent heat stability and temporal stability is easily obtained, and that various refractive indices are easily set to be within the above-mentioned range.

A photoactive compound having the photoreactive group having an N=N bond (azo group) is preferably a compound represented by Formula (I) from the viewpoints that a photo-alignment film having excellent heat stability and temporal stability is easily obtained and that various refractive indices are easily set to be within the above-mentioned range.

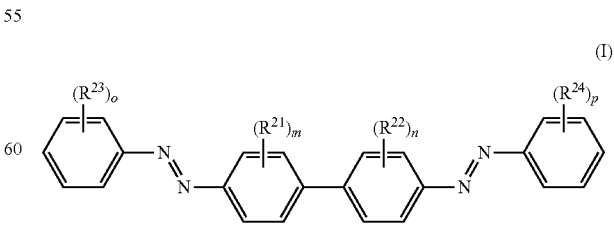

In Formula (I), $R^{21}$, $R^{22}$, $R^{23}$, and $R^{24}$ (hereinafter also simply referred to as "$R^{21}$ to $R^{24}$" in some cases) each independently represent a hydrogen atom or a substituent, provided that at least one of $R^{21}$, . . . , or $R^{24}$ represents a carboxy group, a sulfo group, or a salt thereof.

In Formula (I), m represents an integer of 1 to 4, n represents an integer of 1 to 4, o represents an integer of 1 to 5, p represents an integer of 1 to 5, and in a case where m, n, o, and p are each an integer of 2 or more, a plurality of $R^{21}$'s to $R^{24}$'s may be the same as or different from each other, respectively.

Specific examples of the substituents represented by $R^{21}$ to $R^{24}$ are shown below.

a carboxy group or a salt thereof (which may form a salt together with an alkali metal, and is preferably a carboxy group not forming a salt or forming a sodium salt, and more preferably the carboxy group forming a sodium salt), a sulfo group or a salt thereof (which may form a salt together with an alkali metal, and is preferably a sulfo group not forming a salt or forming a sodium salt, and more preferably the sulfo group forming a sodium salt), an alkyl group (preferably an alkyl group having 1 to 20 carbon atoms, more preferably an alkyl group having 1 to 12 carbon atoms, and particularly preferably an alkyl group having 1 to 8 carbon atoms; and examples of the alkyl group include a methyl group, an ethyl group, an isopropyl group, a tert-butyl group, an n-octyl group, an n-decyl group, an n-hexadecyl group, a cyclopropyl group, a cyclopentyl group, and a cyclohexyl group), an alkenyl group (preferably an alkenyl group having 2 to 20 carbon atoms, more preferably an alkenyl group having 2 to 12 carbon atoms, and particularly preferably an alkenyl group having 2 to 8 carbon atoms; and examples of the alkenyl group include a vinyl group, an allyl group, a 2-butenyl group, and a 3-pentenyl group), an alkynyl group (preferably an alkynyl group having 2 to 20 carbon atoms, more preferably an alkynyl group having 2 to 12 carbon atoms, and particularly preferably an alkynyl group having 2 to 8 carbon atoms; and examples of the alkynyl group include a propargyl group and a 3-pentynyl group), an aryl group (preferably an aryl group having 6 to 30 carbon atoms, more preferably an aryl group having 6 to 20 carbon atoms, and particularly preferably an aryl group having 6 to 12 carbon atoms; and examples of the group include a phenyl group, a 2,6-diethylphenyl group, a 3,5-ditrifluoromethylphenyl group, a naphthyl group, and a biphenyl group), a substituted or unsubstituted amino group (preferably an amino group having 0 to 20 carbon atoms, more preferably an amino group having 0 to 10 carbon atoms, and particularly preferably an amino group having 0 to 6 carbon atoms; and examples of the group include an unsubstituted amino group, a methylamino group, a dimethylamino group, a diethylamino group, and an anilino group), an alkoxy group (preferably an alkoxy group having 1 to 20 carbon atoms, more preferably an alkoxy group having 1 to 10 carbon atoms, and particularly preferably an alkoxy group having 1 to 6 carbon atoms; and examples of the group include a methoxy group, an ethoxy group, and a butoxy group), an alkoxycarbonyl group (preferably an alkoxycarbonyl group having 2 to 20 carbon atoms, more preferably an alkoxycarbonyl group having 2 to 10 carbon atoms, and particularly preferably an alkoxycarbonyl group having 2 to 6 carbon atoms; and examples of the alkoxycarbonyl group include a methoxycarbonyl group and an ethoxycarbonyl group), an acyloxy group (preferably an acyloxy group having 2 to 20 carbon atoms, more preferably an acyloxy group having 2 to 10 carbon atoms, and particularly preferably an acyloxy group having 2 to 6 carbon atoms; and examples of the an acyloxy group include an acetoxy group and a benzoyloxy group), an acylamino group (preferably an acylamino group having 2 to 20 carbon atoms, more preferably an acylamino group having 2 to 10 carbon atoms, and particularly preferably an acylamino group having 2 to 6 carbon atoms; and examples of the acylamino group include an acetylamino group and a benzoylamino group), an alkoxycarbonylamino group (preferably an alkoxycarbonylamino group having 2 to 20 carbon atoms, more preferably an alkoxycarbonylamino group having 2 to 10 carbon atoms, and particularly preferably an alkoxycarbonylamino group having 2 to 6 carbon atoms; and examples of the alkoxycarbonylamino group include a methoxycarbonylamino group), an aryloxycarbonylamino group (preferably an aryloxycarbonylamino group having 7 to 20 carbon atoms, more preferably an aryloxycarbonylamino group having 7 to 16 carbon atoms, and particularly preferably an aryloxycarbonylamino group having 7 to 12 carbon atoms; and examples of the aryloxycarbonylamino group include a phenyloxycarbonylamino group), a sulfonylamino group (preferably a sulfonylamino group having 1 to 20 carbon atoms, more preferably a sulfonylamino group having 1 to 10 carbon atoms, and particularly preferably a sulfonylamino group having 1 to 6 carbon atoms; and examples of the sulfonylamino group include a methanesulfonylamino group and a benzenesulfonylamino group), a sulfamoyl group (preferably a sulfamoyl group having 0 to 20 carbon atoms, more preferably a sulfamoyl group having 0 to 10 carbon atoms, and particularly preferably a sulfamoyl group having 0 to 6 carbon atoms; and examples of the sulfamoyl group include a sulfamoyl group, a methylsulfamoyl group, a dimethylsulfamoyl group, and a phenylsulfamoyl group), a carbamoyl group (preferably a carbamoyl group having 1 to 20 carbon atoms, more preferably a carbamoyl group having 1 to 10 carbon atoms, and particularly preferably a carbamoyl group having 1 to 6 carbon atoms; and examples of the carbamoyl group include an unsubstituted carbamoyl group, a methylcarbamoyl group, a diethylcarbamoyl group, and a phenylcarbamoyl group), an alkylthio group (preferably an alkylthio group having 1 to 20 carbon atoms, more preferably an alkylthio group having 1 to 10 carbon atoms, and particularly preferably an alkylthio group having 1 to 6 carbon atoms; and examples of the alkylthio group include a methylthio group and an ethylthio group), an arylthio group (preferably an arylthio group having 6 to 20 carbon atoms, more preferably an arylthio group having 6 to 16 carbon atoms, and particularly preferably an arylthio group having 6 to 12 carbon atoms; and examples of the arylthio group include a phenylthio group), a sulfonyl group (preferably a sulfonyl group having 1 to 20 carbon atoms, more preferably a sulfonyl group having 1 to 10 carbon atoms, and particularly preferably a sulfonyl group having 1 to 6 carbon atoms; and examples of the sulfonyl group include a mesyl group and a tosyl group), a sulfinyl group (preferably a sulfinyl group having 1 to 20 carbon atoms, more preferably a sulfinyl group having 1 to 10 carbon atoms, and particularly preferably a sulfinyl group having 1 to 6 carbon atoms; and examples of the sulfinyl group include a methanesulfinyl group and a benzenesulfinyl group), a ureido group (preferably a ureido group having 1 to 20 carbon atoms, more preferably a ureido group having 1 to 10 carbon atoms, and particularly preferably a ureido group having 1 to 6 carbon atoms; and examples of the ureido group include an unsubstituted ureido group, a methylureido group, a phenylureido group), a phosphoric acid amido group (preferably a phosphoric acid amido group having 1 to 20 carbon atoms, more preferably a phosphoric acid amido group having 1 to 10 carbon atoms, and particularly preferably a phosphoric acid amido group having 1 to 6 carbon atoms; and examples of the phosphoric acid amido group include a diethyl phosphoric acid amido group and a phenyl phosphoric acid amido group), a hydroxy group, a mercapto group, a halogen atom (for example, a fluorine atom, a chlorine atom, a bromine atom, and an iodine atom), a cyano group, a nitro group, a hydroxamic acid group, a sulfino group, a hydrazino group, an imino group, a heterocyclic group (preferably a heterocyclic group having 1 to 30 carbon atoms, and more preferably a heterocyclic group having 1 to 12 carbon atoms, for example, a heterocyclic group having a heteroatom such as a nitrogen atom, an oxygen atom, and a sulfur atom; and examples of the group include an imidazolyl group, a pyridyl group, a quinolyl group, a furyl group, a piperidyl group, a morpholino group, a benzoxazolyl group, a benzimidazolyl group, and a benzthiazolyl group), and a silyl group (preferably a silyl group having 3 to 40 carbon atoms, more preferably a silyl group having 3 to 30 carbon atoms, and particularly preferably a silyl group having 3 to 24 carbon atoms; and examples of the silyl group include a trimethylsilyl group and a triphenylsilyl group).

These substituents may also be substituted with these substituents. In addition, in a case where two or more of the substituents are contained, the substituents may be the same as or different from each other. Further, if possible, the substituents may be bonded to each other to form a ring.

The substituent represented by each of $R^{21}$ to $R^{24}$ may be a polymerizable group or may also be a group including a polymerizable group.

The group including a polymerizable group or a polymerizable group is preferably a group which is present at a terminal of a molecule, that is, at least one of $R^{23}$ or $R^{24}$ is preferably a group including a polymerizable group or a polymerizable group. In this case, at least one of $R^{23}$ or $R^{24}$ is preferably substituted at the para-position with respect to the azo group.

The polymerizable group is not particularly limited, but the polymerization reaction is preferably an addition polymerization (including ring-opening polymerization) or a polycondensation reaction. In other words, the polymerizable group is preferably a polymerizable group capable of conducting the addition polymerization reaction or the polycondensation reaction. Examples of the polymerizable group are shown below. In the following examples, Et represents an ethyl group and Pr represents a propyl group.

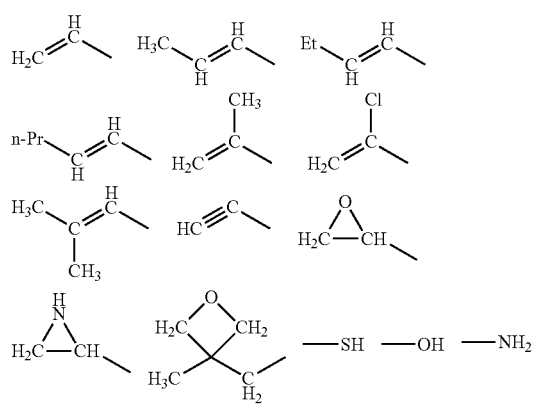

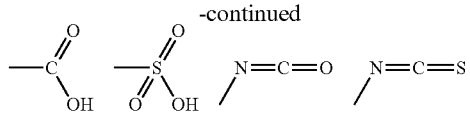

As the polymerizable group, a polymerizable group conducting radical polymerization or cationic polymerization is preferable. As the radically polymerizable group, a generally known radically polymerizable group can be used, and very suitable examples of the radically polymerizable group include a (meth)acrylate group. As the cationically polymerizable group, a generally known cationically polymerizable group can be used, and specific examples of the cationically polymerizable group include an alicyclic ether group, a cyclic acetal group, a cyclic lactone group, a cyclic thioether group, a spiro-ortho ester group, and a vinyloxy group. Among these, the alicyclic ether group and the vinyloxy group are very suitable, and the epoxy group, the oxetanyl group, and the vinyloxy group are particularly preferable.

In Formula (I), $R^{21}$ to $R^{24}$ are each preferably a hydrogen atom, a carboxy group, a sulfo group, a halogen atom, an alkyl group (preferably a halogenated alkyl group), an alkoxy group (preferably a halogenated alkoxy group), a cyano group, a nitro group, an alkoxycarbonyl group, or a carbamoyl group, more preferably a hydrogen atom, a carboxy group, a sulfo group, a halogen atom, a halogenated methyl group, a halogenated methoxy group, a cyano group, a nitro group, or a methoxycarbonyl group, and still more preferably a hydrogen atom, a carboxy group, a sulfo group, a halogen atom, a cyano group, or a nitro group.

At least one of $R^{21}$, . . . , or $R^{24}$ is a carboxy group or a sulfo group. The substitution position of the carboxy group or the sulfo group is not particularly limited, but from the viewpoint of a photoactive action, it is preferable that at least one $R^{21}$ and/or at least one $R^{22}$ is a sulfo group, and it is more preferable that at least one $R^{21}$ and at least one $R^{22}$ are each a sulfo group. Further, from the same viewpoint, it is preferable that at least one $R^{23}$ and/or at least one $R^{24}$ are each a carboxy group, and it is more preferable that at least one $R^{23}$ and at least one $R^{24}$ are each a carboxy group. It is also preferable that the carboxy group is $R^{23}$ or $R^{24}$ substituted at the meta-position with respect to the azo group.

In Formula (I), m represents an integer of 1 to 4, n represents an integer of 1 to 4, o represents an integer of 1 to 5, and p represents an integer of 1 to 5. Preferably, m is an integer of 1 or 2, n is an integer of 1 or 2, o represents an integer of 1 or 2, and p represents an integer of 1 or 2.

Specific examples of the compound represented by Formula (I) are shown below, but are not limited to the following specific examples.

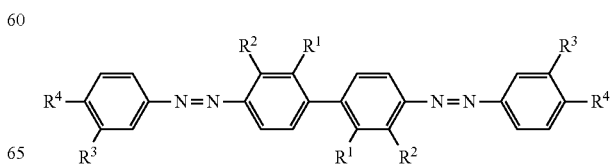

| No. | R¹ | R² | R³ | R⁴ |
|---|---|---|---|---|
| E-1 | —SO₃Na | —H | —COOH | —OH |
| E-2 | —H | —SO₃Na | —COOH | —OH |
| E-3 | —SO₃Na | —H | —COONa | —OH |
| E-4 | —H | —SO₃Na | —COONa | —OH |
| E-5 | —CH₃ | —H | —COONa | —OH |
| E-6 | —H | —CH₃ | —COONa | —OH |
| E-7 | —H | —OCH₃ | —COONa | —OH |
| E-8 | —H | —OCF₃ | —COONa | —OH |
| E-9 | —H | —Cl | —COONa | —OH |
| E-10 | —H | —CN | —COONa | —OH |
| E-11 | —H | —NO₂ | —COONa | —OH |
| E-12 | —COOCH₃ | —H | —COONa | —OH |
| E-13 | —CONH₃ | —H | —COONa | —OH |
| E-14 | —SO₃NH₂ | —H | —COONa | —OH |
| E-15 | —SO₃Na | —H | —COONa | —OH |
| E-16 | —SO₃Na | —H | —CH₂OH | —OH |
| E-17 | —H | —SO₃Na | —CH₂OH | —OH |
| E-18 | —SO₃Na | —H | —COOH | 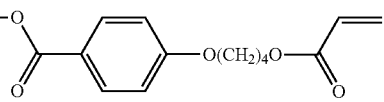 |
| E-19 | —H | —SO₃Na | —COOH | 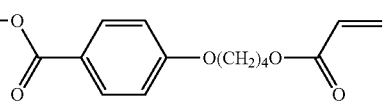 |
| E-20 | —CH₃ | —H | —COONa | 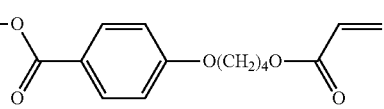 |
| E-21 | —H | —CH₃ | —COONa | 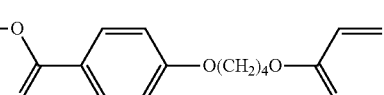 |
| E-22 | —SO₃Na | —H | —CF₃ | 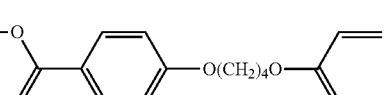 |
| E-23 | —H | —SO₃Na | —CF₃ | 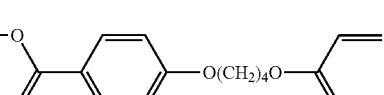 |
| E-24 | —SO₃Na | —H | —COOH | 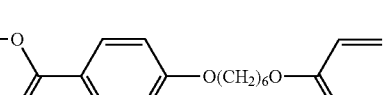 |
| E-25 | —CH₃ | —H | —COONa | 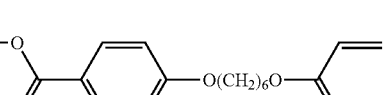 |
| E-26 | —SO₃Na | —H | —CF₃ | 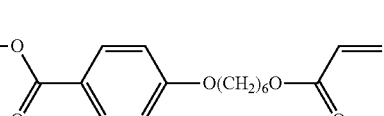 |

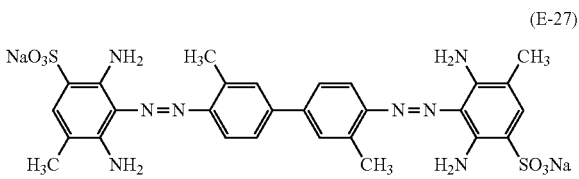
(E-27)

The composition for forming a photo-alignment film may include one or more kinds of additives in addition to the photoactive compound. The additive is added for the purpose of, for example, adjustment of the refractive index of the composition for forming a photo-alignment film.

The additive is preferably a binder component, and from the viewpoint of compatibility with the photoactive compound, a compound having a hydrophilic group and a (meth)acryloyloxy group is preferable. Examples of the hydrophilic group include a hydroxy group, a carboxy group, a sulfo group, and an amino group.

The additive may be added to an extent such that the alignment capability is not remarkably lowered.

In a case where an additive is used for the purpose of adjustment of the refractive index of the composition for forming a photo-alignment film, the refractive index (refractive index at a wavelength of 550 nm) of the additive is preferably 1.40 to 1.60.

In particular from the viewpoint that in a case where the additive is a binder component, it becomes easier to adjust the refractive index of the photo-alignment film, the refractive index (refractive index at a wavelength of 550 nm) of the binder component is preferably 1.40 to 1.60, and more preferably 1.50 to 1.60.

From the viewpoint that the compound having a hydroxy group and a (meth)acryloyloxy group among the compounds having a hydrophilic group and a (meth)acryloyloxy group has more excellent hydrophilic ity, it is preferable that the compound has two or more hydroxy groups. Specific examples of such a compound include monoglycidyl ethers such as glycidyl (meth)acrylate; diglycidyl ethers of dihydric alcohols, such as propylene glycol, butanediol, pentanediol, hexanediol, diethylene glycol, dipropylene glycol, triethylene glycol, tripropylene glycol, tetraethylene glycol, polyethylene glycol, polypropylene glycol, neopentyl glycol, hydroxyl pivalic acid neopentyl glycol, bisphenol A, and ethoxylated bisphenol A; triglycidyl ethers of trihydric alcohols, such as trimethylolpropane, ethoxylated trimethylolpropane, propoxylated trimethylolpropane, and glycerin; an epoxy (meth)acrylate compound obtained by reacting a glycidyl group of a glycidyl ether compound such as polyglycidyl ethers or the like of polyhydric phenols having at least one aromatic ring or alicycle (it should be noted that examples of the polyhydric phenols as mentioned herein include bisphenol compounds or alkylene oxide adducts of the bisphenol compounds, such as bisphenol A, bisphenol F, and bisphenol S, phenol novolak, cresol novolak, or alkylene oxide adducts thereof), with a (meth)acrylic acid; and an alcoholic (meth)acrylate compound obtained by reacting a (meth)acrylic acid with a portion of the hydroxy group of a polyol, such as pentaerythritol di(meth)acrylate, pentaerythritol tri(meth)acrylate, dipentaerythritol di(meth) acrylate, dipentaerythritol tri(meth)acrylate, dipentaerythritol penta(meth)acrylate, glycerin di(meth)acrylate, trimethylolpropane di(meth)acrylate, ditrimethylolpropane di(meth)acrylate, ditrimethylolpropane tri(meth)acrylate, ditrimethylolpropane tetra(meth)acrylate, ditrimethylolpropane hexa(meth)acrylate, ethoxylated trimethylolpropane di(meth)acrylate, propoxylated trimethylolpropane di(meth) acrylate, and tris-2-hydroxyethyl isocyanurate di(meth)acrylate.

Examples of a commercially available product of the compound having a hydroxy group and a (meth)acryloyloxy group include DENACOL ACRYLATE DA-212, DA-111, DA-911 M, and DA-931 (product names, all manufactured by Nagase Chemtex Corp.).

The number of the carboxy groups per molecule of the compound having a carboxy group and a (meth)acryloyloxy group among the compounds having a hydrophilic group and a (meth)acryloyloxy group is not particularly limited from the viewpoint that the hydrophilicity of the carboxy group is sufficiently high, and the number of the carboxy groups may be one or two or more.

However from the viewpoints that a solubility in an organic solvent is improved and an improvement in the crystallinity of the compound can be suppressed, a smaller number the carboxy groups is more preferable within a range such that adhesiveness for adjacent layers and solvent resistance can be maintained. In particular, in a case of a compound having a carboxy group directly linked to an aromatic ring, the number of the carboxy groups per molecule is preferably 2 or less.

Specific examples of the compound having a carboxy group and a (meth)acryloyloxy group include a compound having a carboxy group and at least one or more (meth) acryloyloxy groups per molecule, such as 2-(meth)acryloyloxyethyl hexahydrophthalate, 2-acryloyloxyethyl phthalate, 2-methacryloyloxyethyl phthalate, and ethylene oxide-modified succinic acid acrylate, a compound obtained by adding an acid anhydride such as phthalic anhydride to a compound having a hydroxy group and a (meth)acryloyloxy group, such as 2-hydroxylethyl (meth)acrylate, and a benzoic acid derivative having an alkyl(oxy) group in which a (meth)acryloyloxy group is introduced to the terminal, as a substituent.

In a case of the benzoic acid derivative, the number of the alkyl(oxy) groups in which a (meth)acryloyloxy group is introduced to a terminal, as a substituent, may be 1 or more, but is preferably 1 to 3 from the viewpoint of ease of synthesis. Further, in a case of introduction of an alkyl(oxy) group having a (meth)acryloyloxy group introduced at a plurality of terminals thereof, it is preferable to select a position to lower the symmetry of a molecule as the substitution position from the viewpoint of not extremely increasing the crystallinity.

Specific examples of the benzoic acid derivative include 2-(ω-(meth)acryloyloxyalkyl(oxy))benzoic acid, 2,3-di(ω-(meth)acryloyloxyalkyl(oxy))benzoic acid, 2,4-di(ω-(meth)acryloyloxyalkyl(oxy))benzoic acid, 2,5-di(ω-(meth)acryloyloxyalkyl(oxy))benzoic acid, 3-(ω-(meth)acryloyloxyalkyl(oxy))benzoic acid, 3,4-di(ω-(meth)acryloyloxyalkyl(oxy))benzoic acid, and 4-(ω-(meth)acryloyloxyalkyl(oxy))benzoic acid, in which the number of the methylene groups in the alkyl chain is 1 to 14. In particular, the number of the methylene groups is more preferably 2 to 10.

Examples of a commercially available product of the compound having a carboxy group and a (meth)acryloyloxy group include LIGHT ACRYLATE HOAHH, HOHH, HOMPL, HOMPP, and HOA-MS (product names, all manufactured by Kyoeisha Chemical Co., Ltd.).

The compounds having a hydrophilic group and a (meth) acryloyloxy group may be used alone or in combination of two or more kinds thereof.

Since the compound having a hydrophilic group and a (meth)acryloyloxy group has high hydrophilicity, the compatibility with the compound represented by Formula (I) is good, but there are combinations in which crystallization rarely occurs. In this case, a combination of a compound having a hydrophilic group and a (meth)acryloyloxy group, the crystallinity of which is not remarkably increased in the blended state, with the compound represented by Formula (I) is preferable. With this, the photo-alignment film becomes smooth and thus, an effect on the alignment regulating force becomes weaker.

The presence or absence of crystallization can be determined by, for example, optical observation, spectroscopic analysis, scattering experiment, or the like.

The content of the binder component is preferably 10% by mass or more, more preferably 20% by mass or more, and still more preferably 30% by mass or more, with respect to the total solid content mass of the photo-alignment film (composition for forming a photo-alignment film). In a case where the content of the binder component is 10% by mass or more, there are advantages such as an ability of easy adjustment of the refractive index of the photo-alignment film, and an ability of improving adhesiveness to an adjacent layer and solvent resistance.

An upper limit value of the content of the binder component is preferably 90% by mass or less, more preferably 85% by mass or less, and still more preferably 80% by mass or less, with respect to the total solid content mass of the photo-alignment film (composition for forming a photo-alignment film) from the viewpoint that the alignment regulating force of the compound represented by Formula (I) included in the photo-alignment film is further exhibited.

The composition for forming a photo-alignment film is preferably produced as a coating liquid. The solvent used for the production of the coating liquid is not particularly limited, but a solvent in which a photoactive compound is dissolved is usually used. Examples of the solvent include alcohol-based solvents such as methanol and ethanol, diol-based solvents such as ethylene glycol, propylene glycol, and 1,3-butanediol, ether-based solvents such as tetrahydrofuran, 2-methoxyethanol, 2-butoxyethanol, 2-(2-ethoxyethoxy)ethanol, and 2-(2-butoxyethoxy)ethanol, amide-based solvents such as 2-pyrrolidone, N-methylpyrrolidone, dimethylformamide, and dimethylacetamide, γ-butyrolactone, chlorobenzene, and dimethyl sulfoxide. The solvents may be used alone or in combination of two or more kinds thereof.

The composition for forming a photo-alignment film is preferably produced as a coating liquid having a total solid content mass of 0.2% by mass or more, and more preferably produced as a coating liquid having a total solid content mass of approximately 0.5% to 10% by mass.

As a method for applying the alignment polymer composition or the composition for forming a photo-alignment film onto a substrate (which will be described later), a known method including, for example, a coating method such as a spin coating method, an extrusion method, a gravure coating method, a die-coating method, a bar coating method, and an applicator method, or a printing method such as a flexographic method is employed. Incidentally, in a case where the production of a polarizing element is carried out by a continuous production method in a roll-to-roll mode, the gravure coating method, the die-coating method, or the like as the coating method, or the flexographic method as printing method is preferable.

[Anisotropic Light-Absorbing Film]

The anisotropic light-absorbing film in the present invention is a film formed using a dichroic substance and has a degree S of alignment of 0.92 or more.

The degree S of alignment of the anisotropic light-absorbing film is 0.92 or more, and more preferably 0.94 or more.

In order to enhance the degree of polarization as the polarizing element, it is necessary to enhance the degree of alignment of the dichroic substance, but in a case where the degree of alignment is increased, the refractive index anisotropy of the anisotropic light-absorbing film is increased, and the interface reflection with an adjacent layer tends to be increased. Accordingly, in a case where the degree of alignment is high as above, the present invention is more effective.

The anisotropic light-absorbing film may exhibit reverse wavelength dispersibility. Exhibition of the reverse wavelength dispersibility of the anisotropic light-absorbing film means that an Re value becomes equal or higher as a measurement wavelength is increased in a case where an in-plane retardation (Re) value at a specific wavelength (visible light range) is measured.

The anisotropic light-absorbing film exhibits reverse wavelength dispersibility, and in a case where the ratio ($n_{450}/n_{550}$) of the alignment film is 1.0 or more, the internal reflection at an interface between the anisotropic light-absorbing film and the alignment film can further be suppressed.

The thickness of the anisotropic light-absorbing film is preferably 100 to 8,000 nm, and more preferably 300 to 5,000 nm. By making the anisotropic light-absorbing film into a thin film (having a thickness within the range) as above, the flexibility of the polarizing element can be excellent.

The anisotropic light-absorbing film of the present invention is preferably formed using a composition including a dichroic substance.

(Dichroic Substance)

The dichroic substance in the present invention is not particularly limited as long as the degree S of alignment of the anisotropic light-absorbing film can be set to 0.92 or more. Specific examples thereof include those described in paragraphs [0067] to [0071] of JP2013-228706A, paragraphs [0008] to [0026] of JP2013-227532A, paragraphs [0008] to [0015] of JP2013-209367A, paragraphs [0045] to [0058] of JP2013-014883A, paragraphs [0012] to [0029] of JP2013-109090A, paragraphs [0009] to [0017] of JP2013-101328A, paragraphs [0051] to [0065] of JP2013-037353A, paragraphs [0049] to [0073] of JP2012-063387A, paragraphs [0016] to [0018] of JP1999-305036A (JP-H11-305036A), paragraphs [0009] to [0011] of JP2001-133630A, paragraphs [0030] to [0169] of JP2011-215337A, paragraphs [0021] to [0075] of JP2010-106242A, paragraphs [0011] to [0025] of JP2010-215846A, paragraphs [0017] to [0069] of JP2011-048311A, paragraphs [0013] to [0133] of JP2011-213610A, paragraphs [0074] to [0246] of JP2011-237513A, paragraphs [0022] to [0080] of JP2015-001425, paragraphs [0005] to [0051] of JP2016-006502, paragraphs [0005] to [0041] of WO2016/060173A, paragraphs [0008] to [0062] of WO2016/136561A, paragraphs [0014] to [0033] of JP2016-044909, paragraphs [0014] to [0033] of JP2016-044910, paragraphs [0013] to [0037] of JP2016-095907, paragraphs [0014] to [0034] of JP2017-045296, and the like.

It is preferable that the dichroic substance includes a compound represented by Formula (II) from the viewpoint that an anisotropic light-absorbing film having a degree S of alignment of 0.92 or more is easily obtained.

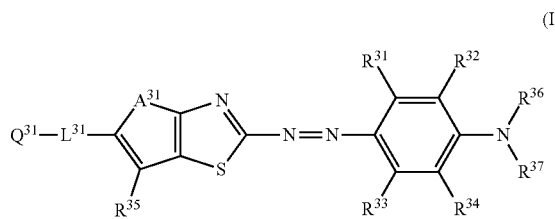

In Formula (II), $R^{31}$, $R^{32}$, $R^{33}$, $R^{34}$, and $R^{35}$ (hereinafter also simply referred to as "$R^{31}$ to $R^{35}$" in some cases) each independently represent a hydrogen atom or a substituent, $R^{36}$ and $R^{37}$ each independently represent a hydrogen atom or an alkyl group which may have a substituent, $Q^{31}$ represents an aromatic hydrocarbon group, an aromatic heterocyclic group, or a cyclohexane ring group, which may have a substituent, $L^{31}$ represents a divalent linking group, and $A^{31}$ represents an oxygen atom or a sulfur atom. $R^{36}$, $R^{37}$, and $Q^{31}$ may have a radically polymerizable group as a substituent.

The anisotropic light-absorbing film may include the dichroic substance as it is, include a polymer of the dichroic substance, or both thereof.

The definitions of the substituent and the radically polymerizable group in Formula (II) are the same as the substituent in Formula (I).

Examples of the aromatic hydrocarbon group represented by $Q^{31}$ include an aryl group having 6 to 12 carbon atoms, and the aromatic hydrocarbon group is preferably a phenyl group.

As the aromatic heterocyclic group represented by $Q^{31}$, a group derived from a monocyclic or bicyclic heterocycle is preferable. Examples of an atom constituting the aromatic heterocyclic group, other than a carbon atom, include a nitrogen atom, a sulfur atom, and an oxygen atom. In a case where the aromatic heterocyclic group has a plurality of atoms constituting a ring other than carbon, these may be the same as or different from each other. Specific examples of the aromatic heterocyclic group include a pyridyl group, a quinolyl group, an isoquinolyl group, a benzothiazolyl group, a phthalimido group, and a thienothiazolyl group.

Examples of the divalent linking group represented by $L^{31}$ include —O—, —(CH$_2$)$_g$—, —(CF$_2$)$_g$—, —Si(CH$_3$)$_2$—, —(Si(CH$_3$)$_2$O)$_g$—, —(OSi(CH$_3$)$_2$)$_g$— (g represents an integer of 1 to 10), —N(Z)—, —C(Z)=C(Z')—, —C(Z)=N—, —N=C(Z)—, —C(Z)$_2$—C(Z')$_2$—, —C(O)—, —OC(O)—, —C(O)O—, —O—C(O)O—, —N(Z)C(O)—, —C(O)N(Z)—, —C(Z)=C(Z')—C(O)O—, —O—C(O)—C(Z)=C(Z')—, —C(Z)=N—, —N=C(Z)—, —C(Z)=C(Z')—C(O)N(Z")—, —N(Z")—C(O)—C(Z)=C(Z')—, —C(Z)=C(Z')—C(O)—S—, —S—C(O)—C(Z)=C(Z')—, —C(Z)=N—N=C(Z')— (Z, Z', and Z" independently represent hydrogen, a C1 to C4 alkyl group, a cycloalkyl group, an aryl group, a cyano group, or a halogen atom), —N=N—, —S—, —S(O)—, —S(O)(O)—, —(O)S(O)O—, —O(O)S(O)O—, —SC(O)—, and —C(O)S—. Among these, —N=N— is preferable.

Specific examples of the compound represented by Formula (II) are shown below, but are not limited to the following specific examples.

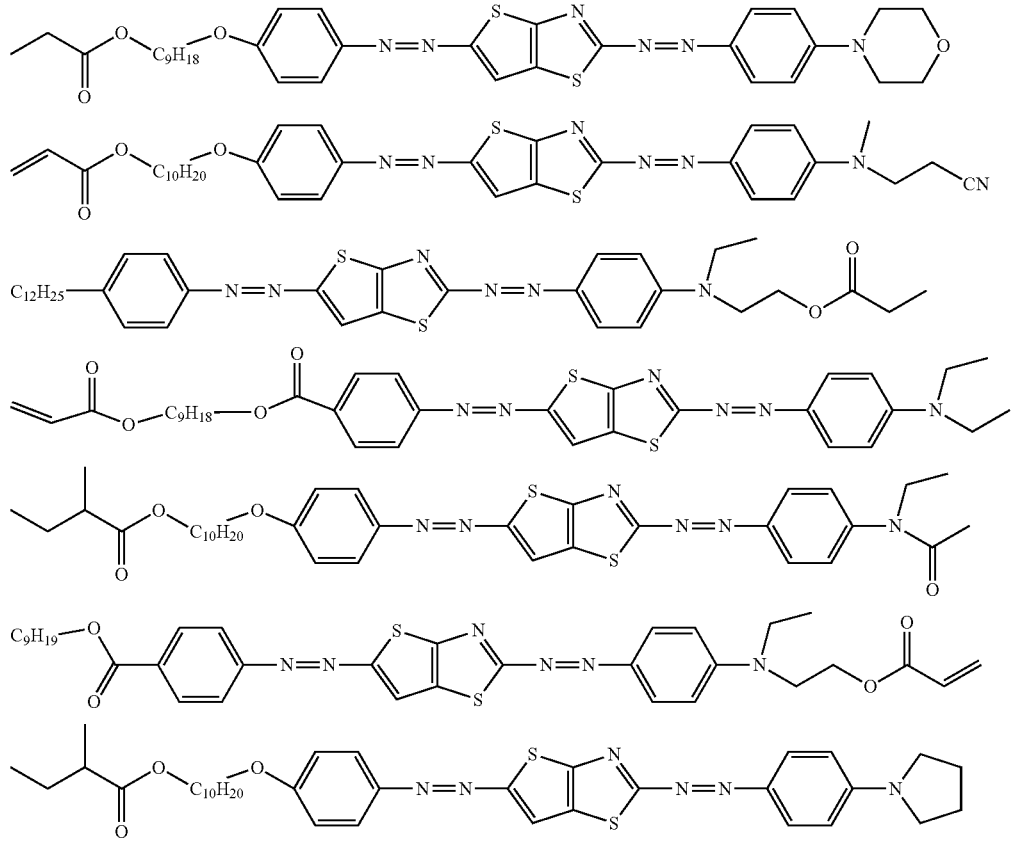

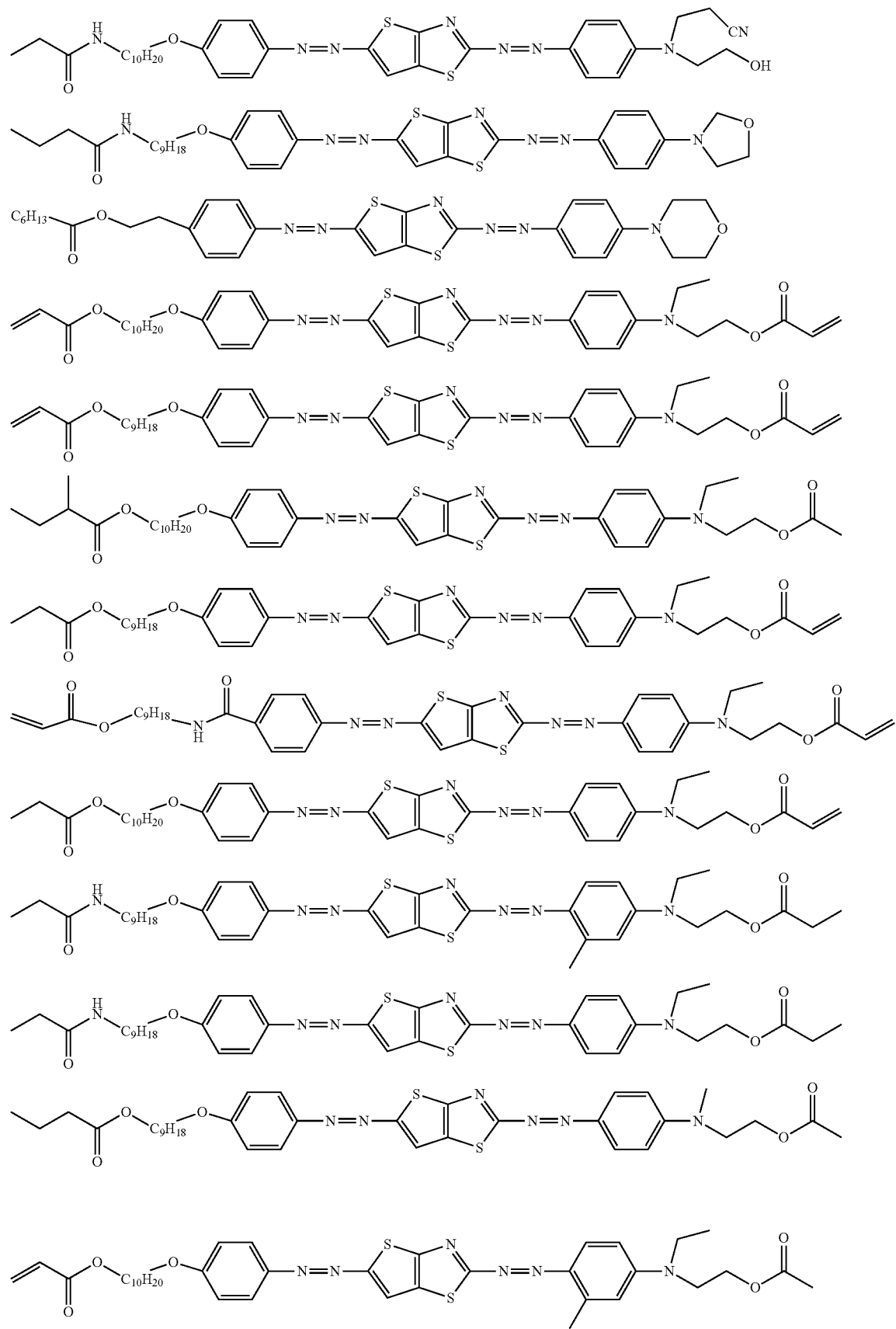

-continued

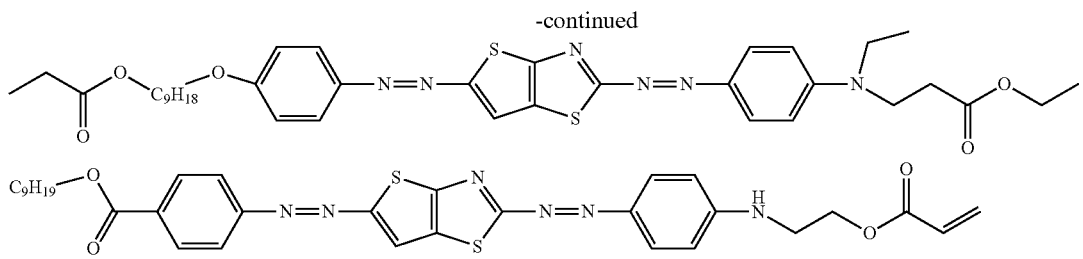

The content of the dichroic substance is preferably 8% to 22% by mass, and more preferably 10% to 20% by mass with respect to the total solid content mass of the anisotropic light-absorbing film. In a case where the content of the dichroic substance is within the range, an anisotropic light-absorbing film having a high degree of alignment can be obtained even in a case where the anisotropic light-absorbing film is made into a thin film. With this, an anisotropic light-absorbing film having excellent flexibility is easily obtained.

The dichroic substances may be used alone or in combination of two or more kinds thereof. In a case where two or more kinds of the dichroic substances are included, the total amount thereof is preferably within the range.

In the present invention, it is preferable that the anisotropic light-absorbing film is a film formed using a composition (hereinafter also referred to as a "liquid crystalline composition") including a liquid crystalline compound together with the above-mentioned dichroic substance for a reason that a dichroic substance can be aligned at a higher degree of alignment while restraining the dichroic substance from being precipitated.

(Liquid Crystalline Compound)

As the liquid crystalline compound included in the liquid crystalline composition, both of a low-molecular liquid crystalline compound and a high-molecular liquid crystalline compound can be used.

Here, the "low-molecular liquid crystalline compound" refers to a liquid crystalline compound having no repeating unit in the chemical structure.

In addition, the "high-molecular liquid crystalline compound" refers to a liquid crystalline compound having a repeating unit in the chemical structure.

Examples of the low-molecular liquid crystalline compound include those described in JP2013-228706A.

Examples of the high-molecular liquid crystalline compound include the thermotropic liquid crystalline polymers described in JP2011-237513A. In addition, the high-molecular liquid crystalline compound may have a crosslinkable group (for example, an acryloyl group and a methacryloyl group) at the terminal.

In a case where the composition of the present invention contains a liquid crystalline compound, the content of the liquid crystalline compound is preferably 70 to 95 parts by mass, and more preferably 70 to 90 parts by mass with respect to 100 parts by mass of the total amount of the dichroic substance and the liquid crystalline compound in the liquid crystalline composition.

The liquid crystalline compounds may be used alone or in combination of two or more kinds thereof. In a case where two or more kinds of the liquid crystalline compounds are included, the total amount thereof is preferably within the range.

(Polymerization Initiator)

The liquid crystalline composition may include a polymerization initiator.

The polymerization initiator is not particularly limited, but is preferably a photosensitive compound, that is, a photopolymerization initiator.

As the photopolymerization initiator, various kinds of compounds can be used with no particular limitation. Examples of the photopolymerization initiator include α-carbonyl compounds (each of the specifications of U.S. Pat. Nos. 2,367,661A and 2,367,670A), acyloin ethers (U.S. Pat. No. 2,448,828A), aromatic acyloin compounds substituted by α-hydrocarbon (US2722512A), polynuclear quinone compounds (each of the specifications of U.S. Pat. No. 3,046,127A and US2951758A), combinations of triarylimidazole dimers and p-aminophenyl ketones (US3549367A), acridine and phenazine compounds (JP1985-105667A (JP-S60-105667A) and US4239850A), oxadiazole compounds (US4212970A), and acylphosphine oxide compounds (JP1988-040799B (JP-S63-040799B), JP1993-029234B (JP-H05-029234B), JP1998-095788A (JP-H10-095788A), and JP1998-029997A (JP-H10-029997A)).

A commercially available product can also be used as such a photopolymerization initiator, and examples thereof include IRGACURE (hereinafter also simply referred to as "Irg")-184, IRGACURE-907, IRGACURE-369, IRGACURE-651, IRGACURE-819, IRGACURE-OXE-01, and IRGACURE-OXE-02, manufactured by BASF In a case where the composition of the present invention contains a polymerization initiator, the content of the polymerization initiator is preferably 0.01 to 30 parts by mass, and more preferably 0.1 to 15 parts by mass with respect to 100 parts by mass of the total amount of the dichroic substance and the liquid crystalline compound in the liquid crystalline composition. In a case where the content of the polymerization initiator is 0.01 parts by mass or more, the durability of the anisotropic light-absorbing film becomes good, whereas in a case where the content of the polymerization initiator is 30 parts by mass or less, the degree of alignment of the anisotropic light-absorbing film becomes better.

The polymerization initiators may be used alone or in combination of two or more kinds thereof. In a case where two or more kinds of the polymerization initiators are included, the total amount thereof is preferably within the range.

(Interface Modifier)

The liquid crystalline composition preferably includes an interface modifier. By incorporation of the interface modifier, effects that the smoothness of the coating surface is improved; the degree of alignment is further improved or cissing and unevenness are suppressed; and the in-plane uniformity is improved are anticipated.

As the interface modifier, a material having a dichroic substance and a liquid crystalline compound horizontal on the coating surface side is preferable, and the compounds (horizontal alignment agents) described in paragraphs [0253] to [0293] of JP2011-237513A can be used.

In a case where the anisotropic light-absorbing film used in the present invention contains an interface modifier, the content of the interface modifier is preferably 0.001 to 5 parts by mass, and more preferably 0.01 to 3 parts by mass with respect to 100 parts by mass of the total amount of the dichroic substance and the liquid crystalline compound in the liquid crystalline composition.

The interface modifiers may be used alone or in combination of two or more kinds thereof. In a case where two or more kinds of the interface modifier are included, the total amount thereof is preferably within the range.

(Solvent)

The liquid crystalline composition preferably includes a solvent from the viewpoint of workability or the like.

Examples of the solvent include organic solvents such as ketones (for example, acetone, 2-butanone, methyl isobutyl ketone, cyclopentanone, and cyclohexanone), ethers (for example, dioxane, tetrahydrofuran, and cyclopentyl methyl ether), aliphatic hydrocarbons (for example, hexane), alicyclic hydrocarbons (for example, cyclohexane), aromatic hydrocarbons (for example, benzene, toluene, xylene, and trimethylbenzene), halogenated carbons (for example, dichloromethane, trichloromethane (chloroform), dichloroethane, dichlorobenzene, and chlorotoluene), esters (for example, methyl acetate, ethyl acetate, and butyl acetate), alcohols (for example, ethanol, isopropanol, butanol, and cyclohexanol), cellosolves (for example, methyl cellosolve, ethyl cellosolve, and 1,2-dimethoxyethane), cellosolve acetates, sulfoxides (for example, dimethyl sulfoxide), amides (for example, dimethylformamide and dimethylacetamide), and heterocyclic compounds (for example, pyridine), and water. These solvents may be used alone or in combination of two or more kinds thereof.

Among these solvents, the organic solvents are preferably used, and the halogenated carbons or the ketones are more preferably used.

In a case where the liquid crystalline composition includes a solvent, the content of the solvent is preferably 80% to 99% by mass, more preferably 83% to 97% by mass, and particularly preferably 85% to 95% by mass with respect to the total mass of the liquid crystalline composition.

The solvents may be used alone or in combination of two or more kinds thereof. In a case where two or more kinds of the solvents are included, the total amount thereof is preferably within the range.

[Substrate]

The polarizing element of the embodiment of the present invention may further have a substrate.

In a case where the substrate is a substrate used for the creation of an optical film or the like, it is not particularly limited. The substrate may have flexibility and peelability, as desired.

An aspect in which the alignment film and the anisotropic light-absorbing film are provided in this order on a substrate, and the substrate is disposed on the side of the alignment film opposite to the anisotropic light-absorbing film is also available.

The substrate is preferably a substrate having transparency with respect to visible light.

The transparency refers to characteristics that a transmittance with respect to rays at a wavelength from 380 to 780 nm is 80% or more. Specific examples of the substrate include a glass substrate and a plastic substrate, and the substrate is preferably the plastic substrate. Examples of a plastic constituting the plastic substrate include plastics including, for example, polyolefins such as polyethylene, polypropylene, and a norbornene-based polymer; cyclic olefin-based resins; polyvinyl alcohol; polyethylene terephthalate; polymethacrylic acid esters; polyacrylic acid esters; cellulose esters such as triacetyl cellulose, diacetyl cellulose and cellulose acetate propionate; polyethylene naphthalate; polycarbonates; polysulfones; polyether sulfones; polyether ketones; polyphenylene sulfides; and polyphenylene oxides and polyimides. Among these, cellulose esters, cyclic olefin-based resins, polyethylene terephthalate, polymethacrylic acid esters, or polyimides are particularly preferable from the viewpoint that they are easily available from the market or the transparency is excellent.

An alignment film formed using a modified polyvinyl alcohol or the like may be formed on a substrate, and the alignment film in the present invention may be formed on the alignment film formed using a modified polyvinyl alcohol or the like.

It is preferable that the thickness of the substrate is smaller to an extent such that the strength and the workability are maintained from the viewpoints that the smaller thickness results in a weight to an extent such that practical handling is allowed and that sufficient transparency can be secured.

The thickness of the glass substrate is, but not limited to, preferably 100 to 3,000 μm, and more preferably 100 to 1,000 μm.

The thickness of the plastic substrate is, but not limited to, preferably 5 to 300 μm, and more preferably 5 to 200 μm.

In a case where the polarizing element of the embodiment of the present invention is used as a circularly polarizing plate which will be described later (in particular, a case where it is used as a circularly polarizing plate in applications of mobile devices), the thickness of the substrate is preferably approximately 5 to 100 μm.

[Refractive Index Difference]

In a case where the refractive index of the anisotropic light-absorbing film is defined as $Nx_{550}$ and the refractive index of the alignment film is defined as $nx_{550}$ in a direction in which an in-plane refractive index of the anisotropic light-absorbing film at a wavelength of 550 nm is maximized, and the refractive index of the anisotropic light-absorbing film is defined as $Ny_{550}$ and the refractive index of the alignment film is defined as $ny_{550}$ in a direction in-plane perpendicular to the direction in which the in-plane refractive index is maximized in the plane of the anisotropic light-absorbing film, it is preferable that Formula (1) is satisfied.

$$|Nx_{550}-nx_{550}|+|Ny_{550}-ny_{550}|<0.3 \qquad \text{Formula (1)}$$

The light at a wavelength of 550 nm is a light at a wavelength such that the light is easily visibly recognized to the human eyes. With this, in a case where Formula (1) is satisfied even though the degree of alignment of the anisotropic light-absorbing film is high and the anisotropy of the refractive index is high, the reflected light is more easily visibly recognized, and therefore, the interface reflection between the anisotropic light-absorbing film and the alignment film can further be suppressed. Thus, a polarizing element satisfying Formula (1) can exhibit a more excellent antireflection function as applied to an image display device.

The value of $|Nx_{550}-nx_{550}|+|Ny_{550}-ny_{550}|$ is less than 0.3, and from the viewpoint that the effect is further exhibited, the value is preferably 0.2 or less.

[Circularly Polarizing Plate]

The circularly polarizing plate of an embodiment of the present invention has the above-mentioned polarizing element and a ¼ wavelength plate.

[¼ Wavelength Plate]

The ¼ wavelength plate used in the present invention is not particularly limited as long as it is usually used, and a polymer film or a ¼ wavelength plate created from a liquid crystalline compound can be used. Examples thereof include PURE-ACE WR (manufactured by Teijin Limited).

In addition, the above-mentioned substrate may also serve as a ¼ wavelength plate.

As the ¼ wavelength plate, a ¼ wavelength plate exhibiting reverse dispersibility is preferably used. In addition, a plurality of layers may be laminated to form a ¼ wavelength plate in combination.

The ¼ wavelength plate and the polarizing element of the embodiment of the present invention may be provided to be in contact with each other, and another layer may be provided between the ¼ wavelength plate and the polarizing element of the embodiment of the present invention. Examples of such a layer include a pressure sensitive adhesive layer or adhesive layer for securing adhesiveness, and a barrier layer.

[Barrier Layer]

A barrier layer may be provided between the polarizing element of the embodiment of the present invention and the ¼ wavelength plate. Incidentally, in a case where a layer (for example, a pressure sensitive adhesive layer and an adhesive layer) other than the barrier layer is provided the polarizing element of the embodiment of the present invention and the ¼ wavelength plate, the barrier layer may be provided, for example, between the polarizing element of the embodiment of the present invention and another layer.

The barrier layer is also called a gas shielding layer (oxygen shielding layer), and has a function of protecting the polarizing element of the embodiment of the present invention from a gas such as oxygen in the air, moisture, the compounds included in an adjacent layer.

With regard to the barrier layer, reference can be made to, for example, the descriptions in paragraphs [0014] to [0054] of JP2014-159124A, paragraphs [0042] to [0075] of JP2017-121721A, paragraphs [0045] to [0054] of JP2017-115076A, paragraphs [0010] to [0061] of JP2012-213938A, or paragraphs [0021] to [0031] of JP2005-169994A.

[Image Display Device]

The image display device of an embodiment of the present invention has the above-mentioned anisotropic light-absorbing film or circularly polarizing plate, and an image display element. In the image display device, the anisotropic light-absorbing film or circularly polarizing plate preferably functions as an antireflection layer.

[Image Display Element]

The image display element is not particularly limited and examples thereof include a liquid crystal cell, an organic electroluminescent (hereinafter abbreviated as "EL") display panel, and a plasma display panel.

Among these, the liquid crystal cell or the organic EL display panel is preferable. That is, as the image display device of the embodiment of the present invention, a liquid crystal display device using a liquid crystal cell as an image display element, or an organic EL display device using an organic EL display panel as an image display element is preferable.

(Liquid Crystal Cell)

The liquid crystal cell used for the liquid crystal display device is preferably in a vertical alignment (VA) mode, an optically compensated bend (OCB) mode, an in-plane-switching (IPS) mode, or a twisted nematic (TN) mode, but is not limited thereto.

In a liquid crystal cell in the TN mode, rod-like liquid crystalline molecules are substantially horizontally aligned with no application of a voltage, and twist-aligned by 60° to 120°. The liquid crystal cell in the TN mode is most frequently used as a color thin film transistor (TFT) liquid crystal display device, and is described in many literatures.

In a liquid crystal cell in the VA mode, rod-like liquid crystalline molecules are substantially vertically aligned with no application of a voltage. The liquid crystal cell in the VA mode includes (1) a narrowly-defined liquid crystal cell in the VA mode in which rod-like liquid crystalline molecules are substantially vertically aligned with no application of a voltage, and are substantially horizontally aligned with the application of a voltage (described in JP1990-176625A (JP-H02-176625A)), (2) a liquid crystal cell (in the MVA mode) in which the VA mode is made into multi-domains in order to expand the viewing angle (described in SID97, Digest of tech. Papers (proceedings) 28 (1997) 845), (3) an liquid crystal cell in a mode (the n-ASM mode) in which rod-like liquid crystalline molecules are substantially vertically aligned with no application of a voltage, and are twistedly aligned in multi-domains with the application of a voltage (described in the proceedings 58 and 59 of Japanese Liquid Crystal Conference (1998)), and (4) a liquid crystal cell in the SURVIVAL mode (announced at LCD internal 98). In addition, the liquid crystal cell in the VA mode may be any one of a patterned vertical alignment (PVA) type, an optical alignment type, and a polymer-sustained alignment (PSA) type. Details of these modes are described in JP2006-215326A and JP2008-538819A.

In a liquid crystal cell in the IPS mode, rod-like liquid crystalline molecules are substantially aligned in parallel to a substrate, and the liquid crystalline molecules respond in a planar manner with the application of an electric field in parallel to a substrate surface. The IPS mode displays a black image in a state in which no electric field is applied thereto, and the absorption axes of a pair of upper and lower polarizing plates are perpendicular to each other. A method of improving the viewing angle by reducing light leakage caused when a black image is displayed in an oblique direction using an optical compensation sheet is disclosed by JP1998-054982A (JP-H10-054982A), JP1999-202323A (JP-H11-202323A), JP1997-292522A (JP-H9-292522A), JP1999-133408A (JP-H11-133408A), JP1999-305217A (JP-H11-305217A), JP1998-307291A (JP-H10-307291A), and the like.

(Organic EL Display Device)

As an organic EL display device as an example of the image display device of the embodiment of the present invention, an aspect in which it has an anisotropic light-absorbing film, a ¼ wavelength plate, and an organic EL display panel in this order from the visibly recognized side can be suitably mentioned.

An aspect in which the organic EL display panel has the above-described circularly polarizing plate having a ¼ wavelength plate and an organic EL display panel in this order from the visibly recognized side is more suitable. In this case, the circularly polarizing plate has a substrate, an alignment film, an anisotropic light-absorbing film, and a ¼ wavelength plate disposed in this order from the visibly recognized side.

In addition, the organic EL display panel is a display panel configured using an organic EL element in which an organic light emitting layer (organic electroluminescence layer) is interposed between electrodes (between a cathode and an anode). The configuration of the organic EL display panel is not particularly limited, and a known configuration is employed.

EXAMPLES

Hereinafter, the present invention will be described in more details with reference to Examples. The materials, the amounts to materials used, the ratios, the treatment details, the treatment procedure, or the like shown in the following Examples can be modified as appropriate while not departing from the spirit of the present invention. Therefore, the scope of the present invention will not be restrictively interpreted by the following Examples.

[Creation of Alignment Film 1]

To 1.0 part by mass of a photo-alignment material E-1 having the following structure were added 41.6 parts by mass of butoxyethanol, 41.6 parts by mass of dipropylene glycol monomethyl, and 15.8 parts by mass of pure water, and the obtained solution was pressure-filtered through a 0.45-μm membrane filter to create a coating liquid 1 for a photo-alignment film. The obtained coating liquid 1 for a photo-alignment film was applied onto a polyethylene terephthalate (PET) substrate and dried at 60° C. for 1 minute. The obtained applied film was irradiated with linear polarized ultraviolet rays (an illuminance of 4.5 mW, an irradiation amount of 500 mJ/cm$^2$) using a polarized ultraviolet exposure device to create an alignment film 1. Various refractive indices and film thicknesses of the obtained alignment film 1 are shown in Table 1.

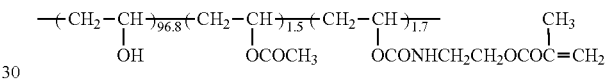

E-1

[Creation of Alignment Film 2]

To 0.67 parts by mass of the photo-alignment material E-1 were added 0.33 parts by mass of DENACOL ACRYLATE DA-212 manufactured by Nagase ChemteX Corporation, 41.6 parts by mass of butoxyethanol, 41.6 parts by mass of dipropylene glycol monomethyl, and 15.8 parts by mass of pure water, and the obtained solution was pressure-filtered through a 0.45-μm membrane filter to create a coating liquid 2 for a photo-alignment film. The obtained coating liquid for a photo-alignment film was applied onto a PET substrate and dried at 60° C. for 1 minute. The obtained applied film was irradiated with linear polarized ultraviolet rays (an illuminance of 4.5 mW, an irradiation amount of 500 mJ/cm$^2$) using a polarized ultraviolet exposure device to create an alignment film 2. Various refractive indices and film thicknesses of the obtained alignment film 2 are shown in Table 1.

[Creation of Alignment Films 3 to 8 and 14]

Alignment films 3 to 8 and 14 were created by the same method as for the alignment film 1, except that the contents of the photo-alignment material E-1 and DENACOL ACRYLATE DA-212 manufactured by Nagase ChemteX Corporation and the irradiation amount of the linear polarized ultraviolet rays were changed as shown in Table 1 below. Various refractive indices and film thicknesses of each of the alignment films are shown in Table 1.

[Creation of Alignment Film 9]

An alignment film coating liquid 9 having the following composition was continuously applied onto a PET substrate with a wire bar of #8. The resultant was dried with hot air at 100° C. for 2 minutes to obtain an alignment film having a thickness of 0.8 μm. Further, a modified polyvinyl alcohol (modified PVA) was added into an alignment film coating liquid such that the concentration of the solid content became 4% by mass. The created alignment film was subjected to a rubbing treatment to create an alignment film 9. Various refractive indices and film thicknesses of the obtained alignment film 9 are shown in Table 1.

Composition of alignment film coating liquid 9
The following modified polyvinyl alcohol

| Water | 70 parts by mass |
|---|---|
| Methanol | 30 parts by mass |

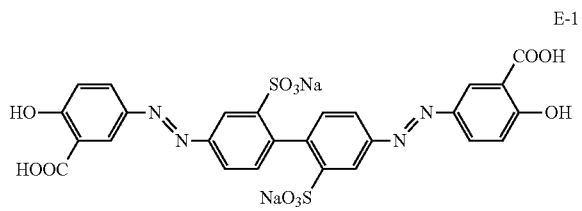

[Creation of Alignment Film 10]
[Synthesis of Polymer C-2]

Into a reaction vessel provided with a stirrer, a thermometer, a dripping funnel, and a reflux cooling pipe were introduced 100.0 parts by mass of 2-(3,4-epoxycyclohexyl)ethyltrimethoxysilane, 500 parts by mass of methyl isobutyl ketone, and 10.0 parts by mass of triethylamine, and the mixture was stirred at room temperature. Next, 100 parts by mass of deionized water was added dropwise to the obtained mixture for 30 minutes with a dripping funnel, and then allowed to undergo a reaction at 80° C. for 6 hours while mixing the mixture under reflux. After completion of the reaction, the organic phase was extracted and washed until water after the washing became neutral with a 0.2%-by-mass aqueous ammonium nitrate solution. Thereafter, the solvent and water were distilled off under reduced pressure from the obtained organic phase to obtain a polyorganosiloxane having an epoxy group as a viscous transparent liquid.

The polyorganosiloxane having an epoxy group was subjected to $^1$H-Nuclear Magnetic Resonance (NMR) analysis, and thus, it was confirmed that peaks based on an oxiranyl group around a chemical shift (δ)=3.2 ppm were obtained as per theoretical strength, and a side reaction of the epoxy group did not occur during the reaction. The weight-average molecular weight Mw and the epoxy equivalent of the polyorganosiloxane having an epoxy group were 2,200 and 186 g/mole, respectively.

Next, into a 100-mL three-neck flask were introduced 10.1 parts by mass of the polyorganosiloxane having an epoxy group obtained above, 0.5 parts by mass of an acryloyl group-containing carboxylic acid (manufactured by Toagosei Co., Ltd., product name "ARONIX M-5300", ω-carboxypolycaprolactone acrylate (a degree of polymerization of n≅2)), 20 parts by mass of butyl acetate, 1.5 parts by mass of a cinnamic acid derivative obtained by the method of Synthesis Example 1 of JP2015-026050A, and 0.3 parts by mass of tetrabutylammonium bromide, and the obtained mixture was stirred at 90° C. for 12 hours. After stirring, the mixture was diluted with butyl acetate in the same amount (mass) as that of the obtained mixture, and the diluted mixture was washed with water three times. An operation in which the obtained mixture was concentrated and diluted with butyl acetate was repeated twice to finally obtain a solution including polyorganosiloxane (the following polymer C-2) having a photo-alignment group. The weight-average molecular weight Mw of the polymer C-2 was 9,000. In addition, as a result of $^1$H-NMR analysis, the amount of the components having a cinnamate group in the polymer C-2 was 23.7% by mass.

[Production of Composition 10 for Forming Alignment Layer]

The following components were mixed to produce a composition 10 for forming an alignment layer.

| | |
|---|---|
| Polymer C-2 | 10.67 parts by mass |
| Low-molecular compound R-1 | 5.17 parts by mass |
| Additive (B-1) | 0.53 parts by mass |
| Butyl acetate | 8,287.37 parts by mass |
| Propylene glycol monomethyl ether acetate | 2,071.85 parts by mass |

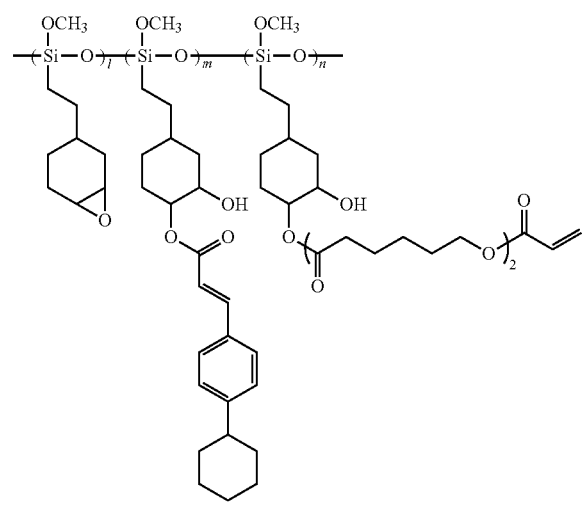

Additive (B-1): TA-60B manufactured by San-Apro Limited (refer to the following structural formula)

The composition 10 for forming an alignment layer was applied onto a PET substrate by a spin coating method, and a support having the composition 10 for forming an alignment layer applied thereon was dried in a hot plate at 80° C. for 5 minutes to remove the solvent, thereby forming a coating film.

The obtained coating film was irradiated with polarized ultraviolet rays (25 mJ/cm$^2$, ultra-high-pressure mercury lamp) to create an alignment film 10. Various refractive indices and film thicknesses of the obtained alignment film 10 are shown in Table 1.

[Creation of Alignment Film 11]

A composition 11 for forming an alignment film was continuously applied onto a PET substrate after drying, using a bar of #4, and the applied composition 11 for forming an alignment film was dried at 80° C. for 15 minutes and then heated at 250° C. for 1 hour to form an applied film on the PET substrate.

The obtained applied film was once irradiated with polarized ultraviolet rays (1,000 mJ/cm$^2$, ultra-high-pressure mercury lamp) to create an alignment film 11 on the PET substrate. Various refractive indices and film thicknesses of the obtained alignment film 11 are shown in Table 1.

| Composition of composition 11 for forming alignment film | |
|---|---|
| SE-130 (product name, manufactured by Nissan Chemical Industries, Ltd., polyimide compound) | 2.0 parts by mass |
| N-Methylpyrrolidone | 98.0 parts by mass |

[Creation of Alignment Film 12]

An alignment film 12 was created by the same method as for the alignment film 9, except that a triacetyl cellulose (TAC) substrate (TG40, manufactured by FUJIFILM Corporation) having a thickness of 40 μm was used as the substrate. Various refractive indices and film thicknesses of the alignment film 12 are shown in Table 1.

[Creation of Alignment Film 13]

The coating liquid 1 for a photo-alignment film was applied onto the alignment film 12 and dried at 60° C. for 1 minute. The obtained applied film was irradiated with linear polarized ultraviolet rays (an illuminance of 4.5 mW, an irradiation amount of 1,000 mJ/cm$^2$) using a polarized ultraviolet exposure device to create an alignment film 13. Various refractive indices and film thicknesses of the obtained alignment film 13 are shown in Table 1.

Example 101

The following liquid crystalline composition 1 was continuously applied onto the obtained alignment film 1 using a wire bar of #11 to form an applied film 101.

The applied film 1 was heated at 140° C. for 90 seconds and was cooled to room temperature. Subsequently, the applied film 1 was heated at 80° C. for 60 seconds and cooled again to room temperature. Thereafter, the film was irradiated under an irradiation condition of an illuminance of 28 mW/cm$^2$ for 60 seconds using a high-pressure mercury lamp to create an anisotropic light-absorbing film (a thickness of 2,000 nm) on the alignment film 1. In this manner, a polarizing element of Example 101 was created. The degree of alignment of the obtained polarizing element 101 is shown in Table 1.

In addition, the anisotropic light-absorbing film was peeled from the polarizing element of Example 101, and the degree S of alignment was measured by the above-mentioned method. The degree S of alignment of the anisotropic light-absorbing film is shown in Table 1.

| Composition of liquid crystalline composition 1 | |
| --- | --- |
| Yellow azo coloring agent Y-1 | 7.1 parts by mass |
| Cyan azo coloring agent C-1 | 9.1 parts by mass |
| High-molecular liquid crystal compound P-1 | 101.1 parts by mass |
| Polymerization initiator IRGACURE 819 (manufactured by BASF) | 1.0 part by mass |
| Interface modifier F-1 | 0.3 parts by mass |
| Cyclopentanone | 617.0 parts by mass |
| Tetrahydrofuran | 264.4 parts by mass |

Interface modifier F-1 (the numerical value in the repeating unit represents % by mole of each repeating unit with respect to all the repeating units in the interface modifier F-1)

Examples 102 to 113 and Comparative Examples 201 to 204

Anisotropic light-absorbing films were created on the alignment films 2 to 14 by the same method as in Example 101, except that the blend ratio of two kinds of dichroic substances was set to be the same as in Example 101 and only the solid fractions of the dichroic substances were changed as in Table 1. In this manner, polarizing elements of Examples 102 to 113 and Comparative Examples 201 to 204 were created.

In addition, the anisotropic light-absorbing film was peeled from the polarizing element of each of Examples and Comparative Examples and the degree S of alignment was measured by the above-mentioned method. The degree S of alignment of the anisotropic light-absorbing film is shown in Table 1.

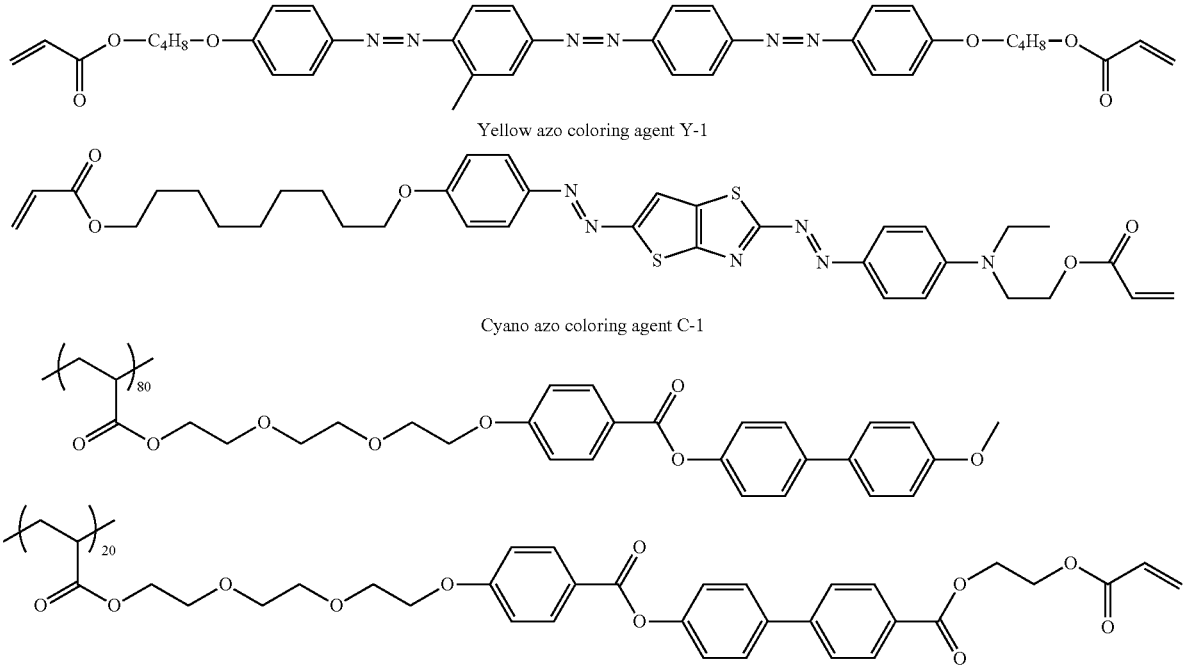

Yellow azo coloring agent Y-1

Cyano azo coloring agent C-1

High-molecular liquid crystal compound P-1 (the numerical value in the repeating unit represents % by mole of each repeating unit with respect to all the repeating units in the high-molecular liquid crystalline compound P-1)

Example 114

The following composition 1 for forming an oxygen shielding layer was continuously applied onto the anisotropic light-absorbing film of Example 113 with a wire bar of #17 and dried at 60° C. for 5 minutes to create a polarizing element of Example 114 in which the oxygen shielding layer was formed on the anisotropic light-absorbing film.

In addition, the anisotropic light-absorbing film was peeled from the polarizing element of Example 114 and the degree S of alignment was measured by the above-mentioned method. The degree S of alignment of the anisotropic light-absorbing film is shown in Table 1.

| Composition 1 for forming oxygen shielding layer | |
|---|---|
| Modified polyvinyl alcohol | 7 parts by mass |
| Water | 72 parts by mass |
| Methanol | 21 parts by mass |

Example 115

The following composition 2 for forming an oxygen shielding layer was continuously applied onto the anisotropic light-absorbing film of Example 113 with a wire bar of #5 and dried at 60° C. for 5 minutes to create a polarizing element of Example 115 in which the oxygen shielding layer was formed on the anisotropic light-absorbing film.

In addition, the anisotropic light-absorbing film was peeled from the polarizing element of Example 115 and the degree S of alignment was measured by the above-mentioned method. The degree S of alignment of the anisotropic light-absorbing film is shown in Table 1.

| Composition 2 for forming oxygen shielding layer | |
|---|---|
| Compound BA-1 (below) | 29 parts by mass |
| Polymerization initiator IRGACURE 819 (manufactured by BASF) | 1 part by mass |
| Ethanol | 70 parts by mass |

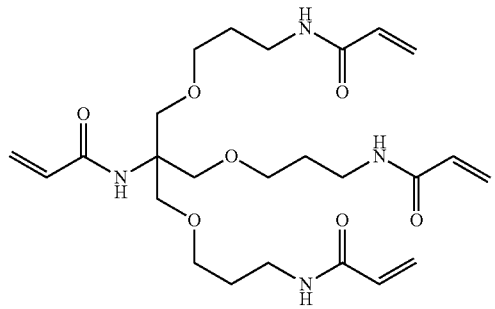

(Compound BA-1)

[Creation of Circularly Polarizing Plate]

A pressure sensitive adhesive (SK-2057, manufactured by Soken Chemical & Engineering Co., Ltd.) was applied onto the side of the anisotropic light-absorbing film of the polarizing element created above (on the side of the oxygen shielding layer in a case where the oxygen shielding layer was formed) to form a pressure sensitive adhesive layer, and PURE-ACE WR (manufactured by Teijin Limited) as a ¼ wavelength plate was adhered thereonto to create a circularly polarizing plate.

GALAXY S5 manufactured by SAMSUNG, having an organic EL panel (organic EL display element) installed therein, was disintegrated, the touch panel to which the circularly polarizing plate was adhered was peeled from the organic EL display device, the circularly polarizing plate was further peeled from the touch panel, and the organic EL display element, the touch panel, and the circularly polarizing plate were each isolated. Subsequently, the isolated touch panel was adhered again to the organic EL display element, which was further adhered to the touch panel such that air did not enter the created circularly polarizing plate, thereby create an organic EL display device.

[Evaluation of Display Performance]

With regard to the organic EL display device created, visibility and display quality were evaluated under illumination. The display screen of the display device was taken as a black display and the reflected light was observed upon irradiation of fluorescent light from the front and at a polar angle of 45 degrees. The display performance was evaluated on the basis of the following criteria. The evaluation results are shown in Table 1.

A: The light is black and the color is not visibly recognized at all.

B: Slight coloration is visibly recognized but the reflectance is very low.

C: Slight coloration is visibly recognized but the reflectance is low.

D: Slight coloration is visibly recognized and the reflectance is high.

E: Clear coloration is visibly recognized and the reflectance is high.

TABLE 1

| | | Alignment film | | | | | | | | |
|---|---|---|---|---|---|---|---|---|---|---|
| | | Material of alignment film | | Binder component | | UV Irradiation amount | Average refractive | Average refractive | Ratio | Refractive index anisotropy | Film thickness |
| | Substrate | Type | Type Parts by mass | Type | Parts by mass | mJ/cm² | index $n_{ave}$ | index $n_{550}$ | ($n_{450}/n_{550}$) | $\Delta n$ | (nm) |
| Example 101 | PET | Alignment film 1 | E-1  1.0 | — | — | 500 | 1.78 | 1.73 | 1.09 | 0.30 | 27 |

TABLE 1-continued

| | | | | | | | | | | | | |
|---|---|---|---|---|---|---|---|---|---|---|---|---|
| Example 102 | PET | Alignment film 11 | SE-130 | — | — | — | 1,000 | 1.68 | 1.64 | 1.09 | 0.10 | 50 |
| Example 103 | PET | Alignment film 2 | E-1 | 0.7 | DA-212 | 0.3 | 500 | 1.69 | 1.65 | 1.08 | 0.21 | 45 |
| Example 104 | PET | Alignment film 3 | E-1 | 0.5 | DA-212 | 0.5 | 500 | 1.65 | 1.61 | 1.07 | 0.18 | 55 |
| Example 105 | PET | Alignment film 4 | E-1 | 0.3 | DA-212 | 0.7 | 500 | 1.62 | 1.58 | 1.02 | 0.16 | 70 |
| Example 106 | PET | Alignment film 5 | E-1 | 1.0 | — | — | 300 | 1.78 | 1.73 | 1.09 | 0.22 | 24 |
| Example 107 | PET | Alignment film 6 | E-1 | 1.0 | — | — | 1,000 | 1.78 | 1.73 | 1.09 | 0.36 | 25 |
| Example 108 | PET | Alignment film 3 | E-1 | 0.5 | DA-212 | 0.5 | 500 | 1.65 | 1.61 | 1.07 | 0.18 | 55 |
| Example 109 | PET | Alignment film 3 | E-1 | 0.5 | DA-212 | 0.5 | 500 | 1.65 | 1.61 | 1.07 | 0.18 | 55 |
| Example 110 | PET | Alignment film 14 | E-1 | 0.5 | DA-212 | 0.5 | 1,000 | 1.65 | 1.61 | 1.07 | 0.24 | 42 |
| Example 111 | PET | Alignment film 7 | E-1 | 1.0 | — | — | 100 | 1.78 | 1.73 | 1.09 | 0.03 | 22 |
| Example 112 | PET | Alignment film 8 | E-1 | 1.0 | — | — | 3,000 | 1.78 | 1.73 | 1.09 | 0.46 | 25 |
| Example 113 | TG40 | Alignment film 13 | E-1 | 1.0 | — | — | 1,000 | 1.78 | 1.73 | 1.09 | 0.30 | 23 |
| Example 114 | TG40 | Alignment film 13 | E-1 | 1.0 | — | — | 1,000 | 1.78 | 1.73 | 1.09 | 0.30 | 23 |
| Example 115 | TG40 | Alignment film 13 | E-1 | 1.0 | — | — | 1,000 | 1.78 | 1.73 | 1.09 | 0.30 | 23 |
| Comparative Example 201 | PET | Alignment film 9 | Modified PVA | — | — | — | — | 1.52 | 1.52 | 1.03 | 0.00 | 800 |
| Comparative Example 202 | PET | Alignment film 10 | C-2 | — | — | — | 25 | 1.51 | 1.52 | 1.01 | 0.02 | 80 |
| Comparative Example 203 | PET | Alignment film 7 | E-1 | 1.0 | — | — | 50 | 1.78 | 1.73 | 1.09 | 0.06 | 55 |
| Comparative Example 204 | TG40 | Alignment film 12 | Modified PVA | — | — | — | — | 1.51 | 1.52 | 1.03 | 0.00 | 800 |

| | Anisotropic light-absorbing film | | | | |
|---|---|---|---|---|---|
| | Amount of Solid content of dichroic substance | Degree S of alignment | $|Nx_{550}-nx_{550}| + |Ny_{550}-ny_{550}|$ | Oxygen shielding layer | Display performance |
| Example 101 | 14% | 0.95 | 0.11 | — | A |
| Example 102 | 14% | 0.95 | 0.18 | — | A |
| Example 103 | 10% | 0.93 | 0.02 | — | A |
| Example 104 | 14% | 0.95 | 0.12 | — | A |
| Example 105 | 14% | 0.94 | 0.17 | — | A |
| Example 106 | 14% | 0.93 | 0.15 | — | A |
| Example 107 | 14% | 0.95 | 0.11 | — | A |
| Example 108 | 21% | 0.95 | 0.18 | — | B |
| Example 109 | 8% | 0.93 | 0.08 | — | A |
| Example 110 | 14% | 0.94 | 0.11 | — | A |
| Example 111 | 14% | 0.92 | 0.22 | — | B |
| Example 112 | 14% | 0.95 | 0.32 | — | B |
| Example 113 | 14% | 0.95 | 0.14 | — | A |
| Example 114 | 14% | 0.95 | 0.14 | Modified PVA | A |
| Example 115 | 14% | 0.95 | 0.14 | BA-1 | A |
| Comparative Example 201 | 14% | 0.94 | 0.26 | — | D |
| Comparative Example 202 | 13% | 0.93 | 0.26 | — | D |
| Comparative Example 203 | 5% | 0.88 | 0.32 | — | D |
| Comparative Example 204 | 14% | 0.94 | 0.26 | — | D |

From Table 1, it was confirmed that in a case where the degree of alignment of the anisotropic light-absorbing film is 0.92 or more and the average refractive index $n_{ave}$ of the alignment film is in the range of 1.55 to 2.0, the display performance of the image display device is excellent (Examples 101 to 115).

On the other hand, it was confirmed that in a case where the degree of alignment of the anisotropic light-absorbing film is less than 0.92 and the average refractive index $n_{ave}$ of the alignment film is out of the range of 1.55 to 2.0, the display performance of the image display device is deteriorated (Comparative Examples 201 to 204).

[Creation of λ/4 Phase Difference Film 1]
[Production of Composition for Photo-Alignment Film]

The same composition as the composition 10 for forming an alignment film used for the formation of the alignment film 10 was produced.

The coating liquid for an optically anisotropic layer having the following composition was produced.

| Coating liquid for optically anisotropic layer | |
|---|---|
| The following polymerization initiator S-1 (oxime-type) | 0.50 parts by mass |
| The following leveling agent G-1 | 0.20 parts by mass |
| HISOLVE MTEM (manufactured by TOHO Chemical Industry Co., Ltd.) | 2.00 parts by mass |
| NKester A-200 (manufactured by Shin Nakamura Chemical Co., Ltd.) | 1.00 part by mass |
| Methyl ethyl ketone | 424.8 parts by mass |

In addition, a group adjacent to the acryloyloxy group of each of the following liquid crystalline compounds L-3 and L-4 represents a propylene group (a group in which is a methyl group is substituted with an ethylene group), and the following liquid crystalline compounds L-3 and L-4 represent a mixture having different positions of the methyl groups.

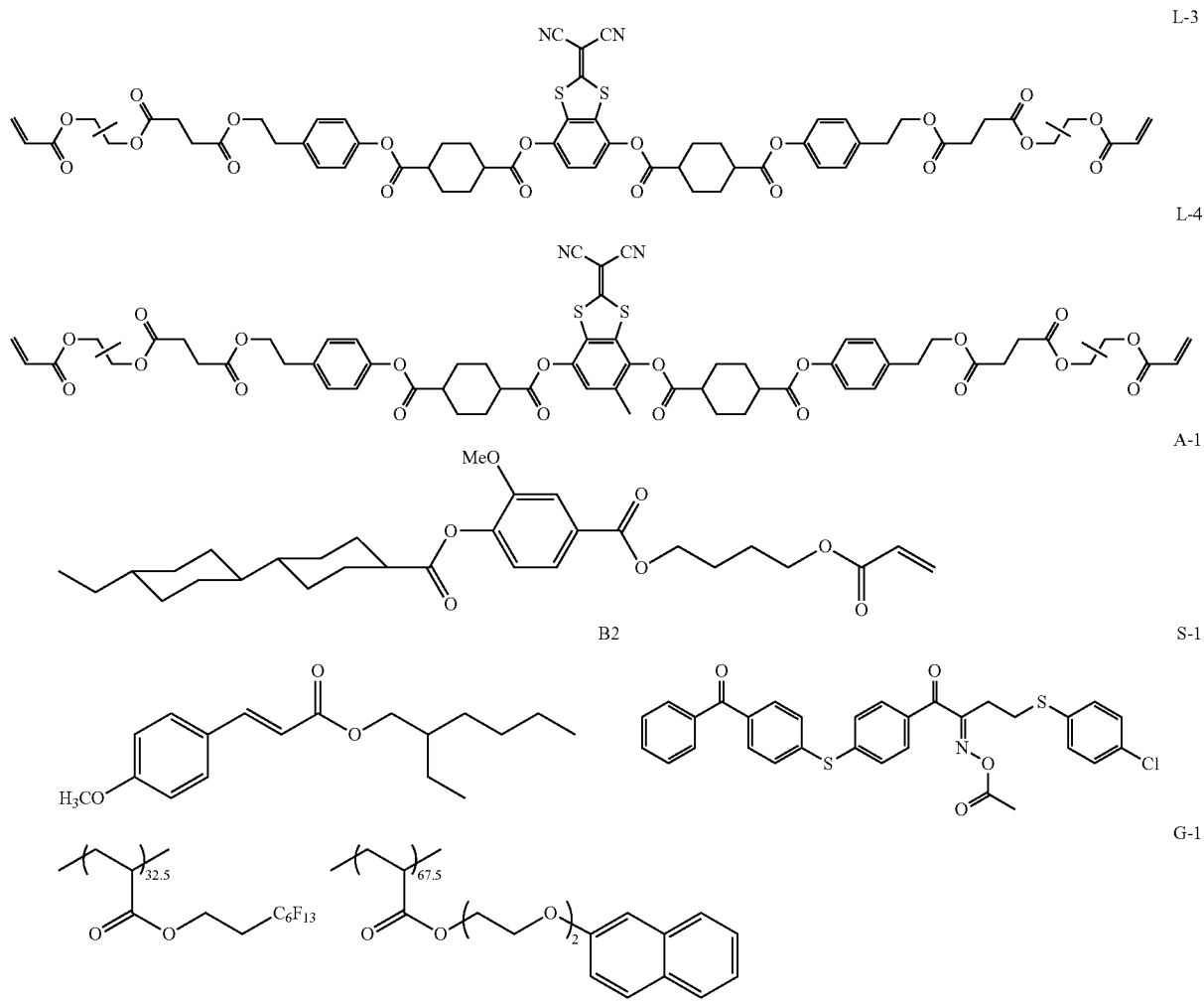

[Creation of Cellulose Acylate Film 1]

(Creation of Core Layer Cellulose Acylate Dope) The following composition was introduced into a mixing tank and stirred to dissolve the respective components, thereby producing a cellulose acetate solution for use as a core layer cellulose acylate dope.

| Coating liquid for optically anisotropic layer | |
|---|---|
| Liquid crystalline compound L-3 | 42.00 parts by mass |
| The following liquid crystalline compound L-4 | 42.00 parts by mass |
| The following polymerizable compound A-1 | 16.00 parts by mass |
| The following low-molecular compound B2 | 6.00 parts by mass |

| Core layer cellulose acylate dope | |
|---|---|
| Cellulose acetate having degree of acetyl substitution of 2.88 | 100 parts by mass |
| Polyester compound B described in Examples of JP2015-227955A | 12 parts by mass |
| The following compound F | 2 parts by mass |
| Methylene chloride (first solvent) | 430 parts by mass |
| Methanol (second solvent) | 64 parts by mass |

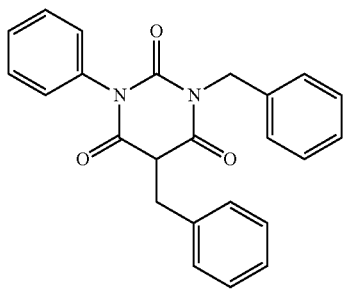

Compound F (Creation of Outer Layer Cellulose Acylate Dope)

To 90 parts by mass of the core layer cellulose acylate dope was added 10 parts by mass of the following matting agent solution to produce a cellulose acetate solution for use as an outer layer cellulose acylate dope.

| Matting agent solution | |
|---|---|
| Silica particle having average particle size of 20 nm (AEROSIL R972, manufactured by Nippon Aerosil Co., Ltd.) | 2 parts by mass |
| Methylene chloride (first solvent) | 76 parts by mass |
| Methanol (second solvent) | 11 parts by mass |
| The above core layer cellulose acylate dope | 1 part by mass |

(Creation of Cellulose Acylate Film 1)

The core layer cellulose acylate dope and the outer layer cellulose acylate dope were filtered through a filter paper having an average pore diameter of 34 µm and a sintered metal filter having an average pore diameter of 10 µm, and then three layers of the core layer cellulose acylate dope and the outer layer cellulose acylate dope on both sides thereof were cast on a drum at 20° C. from the casting ports at the same time (band casting machine).

Subsequently, the film was peeled in the state where the solvent content reached approximately 20% by mass, the both terminals of the film in the width direction were fixed with tenter clips, and the film was dried while being stretched at a stretching ratio of 1.1 times in the cross direction.

Thereafter, the film was transported between rolls in a heat treatment device and further dried to create a cellulose acylate film 1 having a thickness of 40 µm. The in-plane retardation of the obtained cellulose acylate film 1 was 0 nm.

[Creation of λ/4 Phase Difference Film 1]

The composition for the photo-alignment film produced in advance was applied onto a surface on one side of the created cellulose acylate film 1.

After the application, the film was dried in a hot plate at 120° C. for 1 minute to remove the solvent, thereby forming a photoisomerization composition layer having a thickness of 0.3 µm. The obtained photoisomerization composition layer was irradiated with polarized ultraviolet rays (10 mJ/cm$^2$, using an ultra-high-pressure mercury lamp) to form a photo-alignment film.

Subsequently, the coating liquid for an optically anisotropic layer produced in advance was applied onto the photo-alignment film with a bar coater to form a composition layer. The formed composition layer was first heated in a hot plate to 110° C. and then cooled 60° C. to stabilize the alignment. Thereafter, while keeping the temperature at 60° C., the alignment was fixed by irradiation with ultraviolet rays (500 mJ/cm$^2$, using an ultra-high-pressure mercury lamp) in a nitrogen atmosphere (an oxygen concentration of 100 ppm) to form an optically anisotropic layer having a thickness of 2.3 µm, and thus, a λ/4 phase difference film 1 was created.

The in-plane retardation of the obtained λ/4 phase difference film 1 was 140 nm.

[Creation of Positive C Plate Film 2]

A triacetyl cellulose film "Z-TAC" (manufactured by FUJIFILM Corporation) was used as a temporary support (which was referred to as a cellulose acylate film 2). The cellulose acylate film 2 was allowed to pass through a dielectric heating roll at a temperature of 60° C., the film surface temperature was elevated up to 40° C., then an alkali solution having the composition shown below was applied onto one surface of the film at an application amount of 14 ml/m$^2$ using a bar coater, and transported for 10 seconds under a steam-type far infrared heater manufactured by NORITAKE Co., Ltd. while heating at 110° C.

Subsequently, 3 ml/m$^2$ of pure water was applied using the same bar coater.

Subsequently, water washing using a fountain coater and drainage using an air knife were repeated three times, and then, the film was transported to a drying zone for drying at 70° C. for 10 seconds to create a cellulose acylate film 2 which had been subjected to an alkali saponification treatment.

| Composition (parts by mass) of alkali solution | |
|---|---|
| Potassium hydroxide | 4.7 parts by mass |
| Water | 15.8 parts by mass |
| Isopropanol | 63.7 parts by mass |
| Fluorine-containing surfactant SF-1 ($C_{14}H_{29}O(CH_2CH_2O)_{20}H$) | 1.0 part by mass |
| Propylene glycol | 14.8 parts by mass |

A coating liquid for forming an alignment film having the following composition was continuously applied with a wire bar of #8, using the cellulose acylate film 2 which had been subjected to an alkali saponification treatment. The resultant was dried with hot air at 60° C. for 60 seconds and further dried with hot air at 100° C. for 120 seconds to form an alignment film.

| Composition of coating liquid for forming alignment film | |
|---|---|
| PVA (manufactured by Kuraray Ltd., product name "KURARAY POVAL PVA-103" manufactured by Kuraray Co., Ltd.) | 2.4 parts by mass |
| Isopropyl alcohol | 1.6 parts by mass |
| Methanol | 36 parts by mass |
| Water | 60 parts by mass |

The following coating liquid N was applied onto the cellulose acylate film 2 having the alignment film created above, aged at 60° C. for 60 seconds, and then irradiated with ultraviolet rays at 1000 mJ/cm² in air using an air-cooling metal halide lamp (manufactured by Eyegraphics Co., Ltd.) at 70 mW/cm², and the alignment state was fixed to vertically align a rod-like polymerizable liquid crystal compound, thereby creating a positive C plate film 1. The Rth at a wavelength of 550 nm was −60 nm.

| Composition of coating liquid N for optically anisotropic layer | |
|---|---|
| The following liquid crystalline compound L-1 | 80 parts by mass |
| The following liquid crystalline compound L-2 | 20 parts by mass |
| The following vertical aligning agent (S01) for a liquid crystal compound (S01) | 1 part by mass |
| Ethylene oxide-modified trimethylol propane triacrylate (V#360 manufactured by Osaka Organic Chemical Industry Ltd.) | 8 parts by mass |
| IRGACURE 907 (manufactured by BASF) | 3 parts by mass |
| KAYACURE DETX (manufactured by Nippon Kayaku Co., Ltd.) | 1 part by mass |
| The following compound B03 | 0.4 parts by mass |
| Methyl ethyl ketone | 170 parts by mass |
| Cyclohexanone | 30 parts by mass |

GALAXY S5 manufactured by SAMSUNG, having an organic EL panel (organic EL display element) installed therein, was disintegrated, the touch panel to which the circularly polarizing plate was adhered was peeled from the organic EL display device, the circularly polarizing plate was further peeled from the touch panel, and the organic EL display element, the touch panel, and the circularly polarizing plate were each isolated. Subsequently, the isolated touch panel was adhered again to the organic EL display element, which was further adhered to the touch panel such that the side of the circularly polarizing plate created above was the panel side, thereby creating an organic EL display device.

With regard to the created organic EL display device, the same evaluation as in the case using PURE-ACE WR (manufactured by Teijin Limited) as a ¼ wavelength plate was performed, and thus, it was confirmed that the same effect was exhibited in both of the case using the λ/4 phase difference film 1 as the ¼ wavelength plate and the case of using the laminate of the positive C plate film 2 as the ¼ wavelength plate.

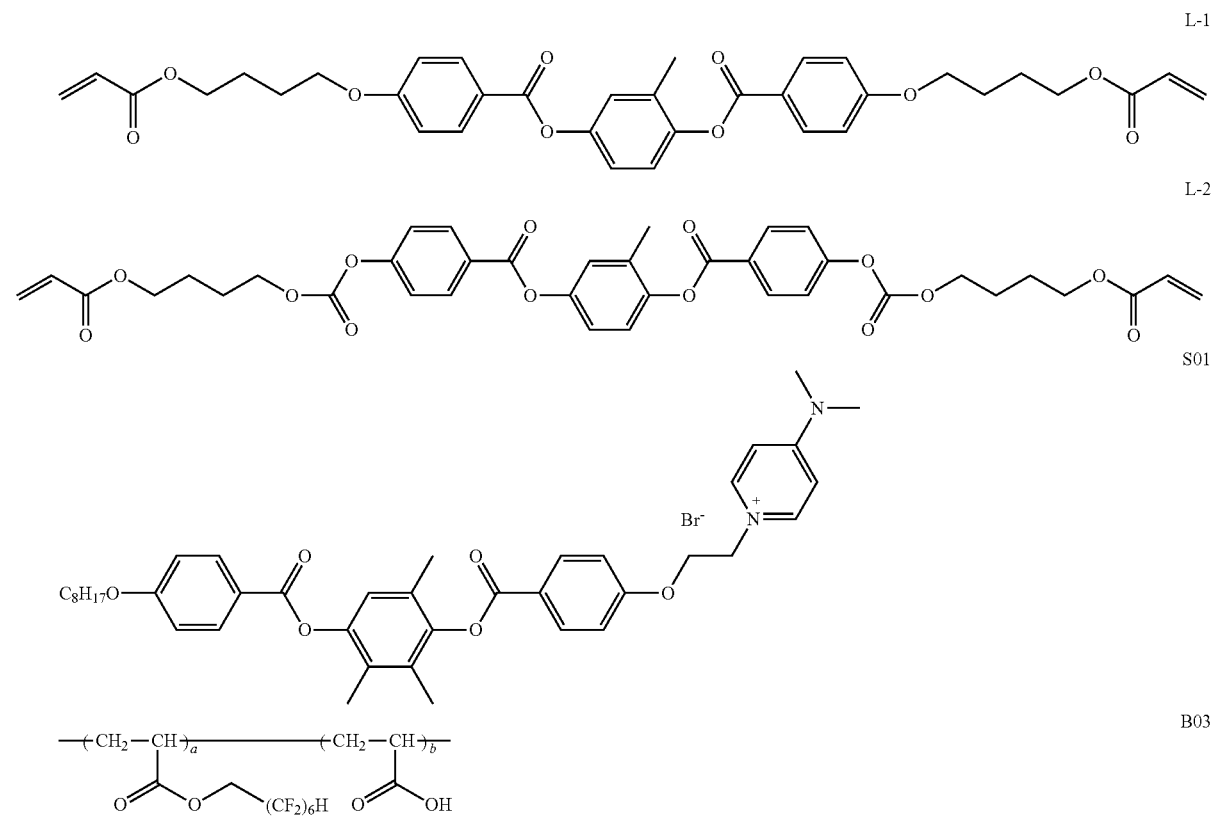

[Creation of Circularly Polarizing Plate]

The positive C plate film 2 created above was transferred to the side of the optically anisotropic layer of the λ/4 phase difference film 1 through a pressure sensitive adhesive, and the cellulose acylate film 2 was removed. In addition, the polarizing element of each of Examples 101 to 115 and Comparative Examples 201 to 204 was adhered to the side of the cellulose acylate film 1 of the λ/4 phase difference film 1 through a pressure sensitive adhesive to obtain a circularly polarizing plate.

[Creation of Alignment Film 21]

The coating liquid 1 for a photo-alignment film was applied onto the alignment film 12 provided on a 40-μm TAC substrate (TG40, manufactured by FUJIFILM Corporation), and dried at 90° C. for 1 minute. The obtained applied film was irradiated with linear polarized ultraviolet rays (an illuminance of 4.5 mW, an irradiation amount of 250 mJ/cm²) using a polarized ultraviolet exposure device to create an alignment film 21. Various refractive indices and film thicknesses of the obtained alignment film 21 are shown in Table 2.

[Creation of Alignment Films 22 to 27]

Alignment films 22 to 27 were created by the same method as for the alignment film 21, except that the contents of the photo-alignment material E-1, DENACOL ACRYLATE DA-212 manufactured by Nagase ChemteX Corporation, and Poly(styrenesulfonic acid)sodium Salt E-2 manufactured by Wako Pure Chemical Industries, Ltd., and the irradiation amounts of the linear polarized ultraviolet rays were changed as shown in Table 2. Various refractive indices and film thicknesses of each of the obtained alignment films are shown in Table 2.

[Creation of Alignment Film 28]

The composition 10 for forming an alignment layer was applied onto the alignment film 12 provided on a 40-µm TAC substrate (TG40, manufactured by FUJIFILM Corporation) by a spin coating method, and a support having the composition 10 for forming an alignment layer applied thereon was dried in a hot plate at 80° C. for 5 minutes to remove the solvent, thereby forming a coating film.

The obtained coating film was irradiated with polarized ultraviolet rays (25 mJ/cm$^2$, ultra-high-pressure mercury lamp) to create an alignment film 28.

Example 301

[Creation of Anisotropic Light-Absorbing Film]

The following liquid crystalline compound 2 was continuously applied onto the obtained alignment film 21 with a wire bar of #5 to form an applied film 301.

The applied film 301 was heated at 140° C. for 90 seconds and the applied film 301 was cooled to room temperature.

Subsequently, the film was heated at 80° C. for 60 seconds and cooled again to room temperature.

Thereafter, the film was irradiated with light for 60 seconds under an irradiation condition of an illuminance of 28 mW/cm$^2$, using a high-pressure mercury lamp, to create an anisotropic light-absorbing film (a thickness of 600 nm) on the alignment film 21.

| Composition of liquid crystalline compound 2 | |
|---|---|
| Yellow azo coloring agent Y-1 | 2.7 parts by mass |
| Cyan azo coloring agent C-1 | 13.5 parts by mass |
| High-molecular liquid crystal compound P-1 | 101.1 parts by mass |
| Polymerization initiator IRGACURE819 (manufactured by BASF) | 1.0 part by mass |
| Interface modifier F-1 | 0.5 parts by mass |
| Cyclopentanone | 617.0 parts by mass |
| Tetrahydrofuran | 264.4 parts by mass |

[Creation of Oxygen Shielding Layer]

The composition 2 for forming an oxygen shielding layer was continuously applied onto the anisotropic light-absorbing film 301 with a wire bar of #5 and dried at 60° C. for 5 minutes to prepare a polarizing element in which the oxygen shielding layer was formed on the anisotropic light-absorbing film. In this manner, a polarizing element of Example 301 was created. The degree of alignment of the obtained polarizing element is shown in Table 2.

Furthermore, the anisotropic light-absorbing film was peeled from the polarizing element of Example 301, and the degree S of alignment was measured by the above-mentioned method. The degree S of alignment of the anisotropic light-absorbing film is shown in Table 2.

Examples 302 to 310 and Comparative Examples 401 to 403

Anisotropic light-absorbing films were created on the alignment films 12 and 21 to 28 by the same method as in Example 301, except that the blend ratio of two kinds of dichroic substances was set to be the same as in Example 301 and only the solid fractions of the dichroic substances were changed as in Table 2. In this manner, polarizing elements of Examples 302 to 308 and Comparative Examples 401 to 404 were created.

In addition, the anisotropic light-absorbing film was peeled from the polarizing element of each of Examples and Comparative Examples and the degree S of alignment was measured by the above-mentioned method. The degree S of alignment of the anisotropic light-absorbing film is shown in Table 2.

[Creation of Circularly Polarizing Plate]

The above-mentioned positive C plate film 2 was transferred to the side of the optically anisotropic layer of the λ/4 phase difference film 1 through a pressure sensitive adhesive, and the cellulose acylate film 2 was removed. In addition, the polarizing element of each of Examples 301 to 308 and Comparative Examples 401 to 403 was adhered to the side of the cellulose acylate film 1 of the λ/4 phase difference film 1 through a pressure sensitive adhesive to obtain a circularly polarizing plate.

GALAXY S5 manufactured by SAMSUNG, having an organic EL panel (organic EL display element) installed therein, was disintegrated, the touch panel to which the circularly polarizing plate was adhered was peeled from the organic EL display device, the circularly polarizing plate was further peeled from the touch panel, and the organic EL display element, the touch panel, and the circularly polarizing plate were each isolated. Subsequently, the isolated touch panel was adhered again to the organic EL display element, which was further adhered to the touch panel such that the side of the circularly polarizing plate created above was the panel side, thereby creating an organic EL display device.

[Evaluation of Display Performance]

With regard to each of the organic EL display devices obtained using the polarizing elements of Examples 301 to 308 and Comparative Examples 401 to 403, evaluation of the display performance was performed on the basis of the same evaluation of display performance and the same evaluation standards as for the display device obtained using the above-mentioned polarizing element of Example 101. The evaluation results are shown in Table 2.

TABLE 2

| | | Alignment film | | | | | | | | | Anisotropic light absorbing film | | | |
|---|---|---|---|---|---|---|---|---|---|---|---|---|---|---|
| | | Material of alignment film | | UV Irradiation amount mJ/cm² | Binder component | | Average refractive index $n_{ave}$ | Average refractive index $n_{550}$ | Ratio ($n_{450}/n_{550}$) | Refractive index anisotropy Δn | Film thickness (nm) | Solid content of dichroic substance | Degree S of alignment | Oxygen shielding layer | Display performance |
| | Substrate | Type | Parts by mass | | Type | Parts by mass | | | | | | | | | |
| Example 301 | TG40 | Alignment film 21 | E-1 | 1.0 | 250 | — | — | 1.82 | 1.76 | 1.09 | 0.22 | 15 | 14% | 0.96 | BA-1 | C |
| Example 302 | TG40 | Alignment film 21 | E-1 | 1.0 | 250 | — | — | 1.82 | 1.76 | 1.09 | 0.22 | 15 | 9% | 0.95 | BA-1 | C |
| Example 303 | TG40 | Alignment film 21 | E-1 | 1.0 | 700 | — | — | 1.82 | 1.76 | 1.09 | 0.35 | 18 | 13% | 0.96 | BA-1 | C |
| Example 304 | TG40 | Alignment film 22 | E-1 | 0.7 | 300 | DA-212 | 0.3 | 1.76 | 1.71 | 1.07 | 0.18 | 40 | 14% | 0.96 | BA-1 | B |
| Example 305 | TG40 | Alignment film 23 | E-1 | 0.7 | 300 | E-2 | 0.3 | 1.82 | 1.77 | 1.02 | 0.22 | 50 | 13% | 0.96 | BA-1 | B |
| Example 306 | TG40 | Alignment film 24 | E-1 | 0.3 | 300 | DA-212 | 0.7 | 1.68 | 1.64 | 1.05 | 0.15 | 110 | 15% | 0.96 | BA-1 | B |
| Example 307 | TG40 | Alignment film 25 | E-1 | 0.3 | 300 | DA-212 | 0.7 | 1.68 | 1.64 | 1.05 | 0.15 | 60 | 14% | 0.96 | BA-1 | A |
| Example 308 | TG40 | Alignment film 26 | E-1 | 0.3 | 300 | DA-212 | 0.7 | 1.68 | 1.64 | 1.05 | 0.15 | 55 | 20% | 0.97 | BA-1 | A |
| Comparative Example 401 | TG40 | Alignment film 27 | Modified PVA | — | — | — | — | 1.52 | 1.52 | 1.03 | 0.0 | 800 | 14% | 0.95 | BA-1 | E |
| Comparative Example 402 | TG40 | Alignment film 21 | E-1 | 1.0 | 250 | — | — | 1.82 | 1.76 | 1.09 | 0.22 | 15 | 7% | 0.90 | BA-1 | E |
| Comparative Example 403 | TG40 | Alignment film 28 | C-2 | — | 25 | — | — | 1.51 | 1.52 | 1.01 | 0.05 | 100 | 13% | 0.92 | BA-1 | E |

In Table 2, it was confirmed that in a case where the degree of alignment of the anisotropic light-absorbing film is 0.92 or more and the average refractive index $n_{ave}$ of the alignment film is in the range of 1.55 to 2.0, the display performance of the image display device is excellent (Examples 301 to 308).

On the other hand, it was confirmed that in a case where the degree of alignment of the anisotropic light-absorbing film is less than 0.92 and the average refractive index $n_{ave}$ of the alignment film is out of the range of 1.55 to 2.0, the display performance of the image display device is deteriorated (Comparative Examples 401 to 403).

What is claimed is:

1. A polarizing element comprising:
   an alignment film; and
   an anisotropic light-absorbing film formed using a liquid crystalline composition containing a dichroic substance and a liquid crystalline compound,
   wherein the alignment film is a photo-alignment film formed of a composition for forming a photo-alignment film,
   wherein the composition for forming the photo-alignment film has a compound having a (meth) acryloyloxy group and a compound having a photoreactive group,
   wherein a content of the liquid crystalline compound is 70 to 95 parts by mass with respect to 100 parts by mass of a total amount of the dichroic substance and the liquid crystalline compound in the liquid crystalline composition,
   wherein a total content of the dichroic substance is 15% or less by mass with respect to a total solid content mass of the anisotropic light-absorbing film,
   wherein a degree S of alignment of the anisotropic light-absorbing film is 0.92 or more, and
   wherein an average refractive index nave at a wavelength of 400 to 700 nm of the alignment film is 1.55 to 2.0.

2. The polarizing element according to claim 1,
   wherein a total content of the dichroic substance is 8% to 15% by mass with respect to a total solid content mass of the anisotropic light-absorbing film.

3. The polarizing element according to claim 1,
   wherein an in-plane refractive index anisotropy Δn at a wavelength of 550 nm of the alignment film is 0.10 or more.

4. The polarizing element according to claim 3,
   wherein the refractive index anisotropy Δn is 0.20 or more.

5. The polarizing element according to claim 1,
   wherein the average refractive index $n_{ave}$ is 1.55 to 1.80.

6. The polarizing element according to claim 1,
   wherein an average refractive index $n_{550}$ at a wavelength of 550 nm of the alignment film is 1.55 to 1.75.

7. The polarizing element according to claim 1,
   wherein a ratio of an average refractive index $n_{450}$ at a wavelength of 450 nm of the alignment film to the average refractive index $n_{550}$ at a wavelength of 550 nm of the alignment film is 1.0 or more.

8. A polarizing element comprising:
   an alignment film; and
   an anisotropic light-absorbing film formed using a liquid crystalline composition containing a dichroic substance and a liquid crystalline compound,
   wherein a content of the liquid crystalline compound is 70 to 95 parts by mass with respect to 100 parts by mass of a total amount of the dichroic substance and the liquid crystalline compound in the liquid crystalline composition,
   wherein a content of the dichroic substance is 22% or less by mass with respect to a total solid content mass of the anisotropic light-absorbing film,
   wherein a degree S of alignment of the anisotropic light-absorbing film is 0.92 or more,
   wherein an average refractive index $n_{ave}$ at a wavelength of 400 to 700 nm of the alignment film is 1.55 to 2.0,
   wherein in a case where a refractive index of the anisotropic light-absorbing film is defined as $Nx_{550}$ and a refractive index of the alignment film is defined as $nx_{550}$ in a direction in which an in-plane refractive index of the anisotropic light-absorbing film at a wavelength of 550 nm is maximized, and
   wherein a refractive index of the anisotropic light-absorbing film is defined as $Ny_{550}$ and a refractive index of the alignment film is defined as $ny_{550}$ in a direction in-plane perpendicular to the direction in which the in-plane refractive index of the anisotropic light-absorbing film is maximized,
   Formula (1) is satisfied, $$|Nx_{550}-nx_{550}|+|Ny_{550}-ny_{550}|<0.3 \qquad \text{Formula (1)}.$$

9. The polarizing element according to claim 1,
   wherein a thickness of the alignment film is 10 nm to 100 nm.

10. The polarizing element according to claim 1,
    wherein the alignment film is a photo-alignment film formed using a photoactive compound having a photoreactive group having an azo group.

11. The polarizing element according to claim 10,
    wherein the photoactive compound is a compound represented by Formula (I),

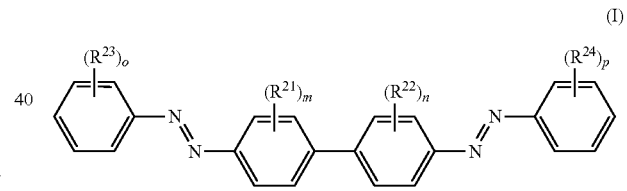

in Formula (I), $R^{21}$, $R^{22}$, $R^{23}$, and $R^{24}$ each independently represent a hydrogen atom or a substituent, provided that at least one of $R^{21}$, $R^{22}$, $R^{23}$, or $R^{24}$ represents a carboxy group, a sulfo group, or a salt thereof, and in Formula (I), m represents an integer of 1 to 4, n represents an integer of 1 to 4, o represents an integer of 1 to 5, p represents an integer of 1 to 5, and in a case where m, n, o, and p are each an integer of 2 or more, a plurality of $R^{21}$'s, $R^{22}$'s, $R^{23}$'s, and $R^{24}$'s may be the same as or different from each other, respectively.

12. The polarizing element according to claim 10,
    wherein the photo-alignment film includes a binder component having a refractive index of 1.50 to 1.60, and
    a content of the binder component is 10% by mass or more with respect to a total solid content mass of the photo-alignment film.

13. The polarizing element according to claim 1,
    wherein the alignment film is a film formed using either or both of polyamic acid and polyimide compounds.

14. The polarizing element according to claim 1,
    wherein the dichroic substance includes a compound represented by Formula (II),

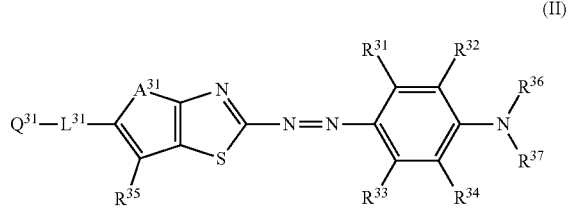
(II)

in Formula (II), $R^{31}$, $R^{32}$, $R^{33}$, $R^{34}$, and $R^{35}$ each independently represent a hydrogen atom or a substituent, $R^{36}$ and $R^{37}$ each independently represent a hydrogen atom or an alkyl group which may have a substituent, $Q^{31}$ represents an aromatic hydrocarbon group, an aromatic heterocyclic group, or a cyclohexane ring group, which may have a substituent, $L^{31}$ represents a divalent linking group, $A^{31}$ represents an oxygen atom or a sulfur atom, and $R^{36}$, $R^{37}$, and $Q^{31}$ may have a radically polymerizable group as a substituent.

15. The polarizing element according to claim 1, wherein the anisotropic light-absorbing film exhibits reverse wavelength dispersibility.

16. The polarizing element according to claim 1, further comprising a substrate,
wherein the polarizing element has the substrate, the alignment film, and the anisotropic light-absorbing film in this order.

17. A circularly polarizing plate comprising:
the polarizing element according to claim 1; and
a ¼ wavelength plate.

18. An image display device comprising:
the polarizing element according to claim 1; and
an image display element.

19. An image display device comprising:
the circularly polarizing plate according to claim 17; and
an image display element.

* * * * *